US012609620B2

(12) United States Patent     (10) Patent No.:   US 12,609,620 B2

Chopra et al.          (45) Date of Patent:     Apr. 21, 2026

(54) SYSTEM AND METHOD FOR CALCULATING THE OUTPUT POWER OF A FLYBACK CONVERTER

(71) Applicant: SEMICONDUCTOR COMPONENTS INDUSTRIES, LLC, Scottsdale, AZ (US)

(72) Inventors: Dhruv Chopra, Gilbert, AZ (US); Armando Gabriel Mesa, Tempe, AZ (US); John D. Stone, Tempe, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 191 days.

(21) Appl. No.: 18/765,910

(22) Filed: Jul. 8, 2024

(65) Prior Publication Data

US 2026/0009828 A1     Jan. 8, 2026

(51) Int. Cl.

| | |
|---|---|
| *H02M 3/335* | (2006.01) |
| *G01R 21/127* | (2006.01) |
| *H02M 1/00* | (2006.01) |
| *H02M 1/42* | (2007.01) |

(52) U.S. Cl.

CPC ...... *H02M 3/33523* (2013.01); *G01R 21/127* (2013.01); *H02M 1/0032* (2021.05); *H02M 1/0045* (2021.05); *H02M 1/0048* (2021.05); *H02M 1/4208* (2013.01); *H02M 1/4225* (2013.01); *H02M 1/0058* (2021.05)

(58) Field of Classification Search

CPC .............. G01R 21/127; H02M 1/0032; H02M 1/0045; H02M 1/0048; H02M 1/4208; H02M 1/4225; H02M 3/33523; H02M 1/0058

See application file for complete search history.

(56) References Cited

U.S. PATENT DOCUMENTS

| | | | | |
|---|---|---|---|---|
| 9,301,365 | B2 | 3/2016 | Reed | |
| 9,621,053 | B1* | 4/2017 | Telefus | H02M 3/33507 |
| 10,397,992 | B2 | 8/2019 | Cohen | |
| 10,784,789 | B1* | 9/2020 | Nasir | H02M 1/08 |
| 2007/0019343 | A1* | 1/2007 | Barbehenn | H02M 1/32 |
| | | | | 361/18 |
| 2008/0130325 | A1* | 6/2008 | Ye | H02M 3/33507 |
| | | | | 363/21.16 |

(Continued)

OTHER PUBLICATIONS

Product Data Sheet—NCP1937 Combination Power Factor Correction and Quasi-Resonant Flyback Controllers for Adapters; Rev. 8, Jun. 2022, 40 pages.

*Primary Examiner* — Yusef A Ahmed

(74) *Attorney, Agent, or Firm* — Slayden Grubert Beard PLLC

(57) ABSTRACT

A power detector is disclosed. The power detector includes a primary-side sense circuit configured to generate a sense signal representative of an output voltage of a flyback converter. The power detector also includes a primary-side reference generator configured to generate a reference signal representative of an average output current of the flyback converter. The power detector further includes a primary-side power calculation circuit configured to generate an output-power signal in response to the sense signal and the reference signal.

20 Claims, 9 Drawing Sheets

(56) References Cited

U.S. PATENT DOCUMENTS

| | | | | | |
|---|---|---|---|---|---|
| 2008/0259655 A1* | 10/2008 | Wei | ........................ | H03K 3/017 | 327/175 |
| 2008/0298095 A1* | 12/2008 | Chuang | ............. | H02M 3/33523 | 363/21.12 |
| 2010/0195355 A1* | 8/2010 | Zheng | ................ | H02M 3/33507 | 363/21.12 |
| 2010/0208500 A1* | 8/2010 | Yan | .................... | H02M 3/33523 | 363/21.12 |
| 2010/0295470 A1* | 11/2010 | Koutensky | ........ | H02M 3/33523 | 363/21.18 |
| 2011/0285301 A1* | 11/2011 | Kuang | .................... | H05B 45/10 | 315/200 R |
| 2012/0075891 A1* | 3/2012 | Zhang | ..................... | H02M 1/08 | 363/21.18 |
| 2012/0163040 A1* | 6/2012 | Zhang | .................. | H02M 3/335 | 363/21.12 |
| 2012/0170330 A1* | 7/2012 | Yang | .................. | H02M 1/4258 | 363/21.13 |
| 2012/0243269 A1* | 9/2012 | Ren | .................. | H02M 3/33507 | 363/21.12 |
| 2012/0262961 A1* | 10/2012 | Chien | ............... | H02M 3/33507 | 363/84 |
| 2013/0077358 A1* | 3/2013 | Gaknoki | ........... | H02M 3/33507 | 327/309 |
| 2013/0113375 A1* | 5/2013 | Leung | ................. | H05B 45/385 | 315/85 |
| 2013/0148387 A1* | 6/2013 | Ren | ........................ | H02M 1/36 | 363/21.16 |
| 2013/0229829 A1* | 9/2013 | Zhang | ..................... | H02M 3/01 | 363/16 |
| 2014/0029315 A1* | 1/2014 | Zhang | ............... | H02M 3/33507 | 363/21.13 |
| 2014/0140109 A1* | 5/2014 | Valley | ................. | H02M 1/4258 | 363/21.17 |
| 2014/0211519 A1* | 7/2014 | Hsu | .................... | H02M 1/4258 | 363/21.17 |
| 2014/0268918 A1* | 9/2014 | Gong | ............... | H02M 3/33523 | 363/21.15 |
| 2014/0268924 A1* | 9/2014 | Tang | ................. | H02M 3/33507 | 363/21.17 |
| 2014/0301116 A1* | 10/2014 | Zhang | ............... | H02M 3/33523 | 363/21.15 |
| 2015/0023069 A1* | 1/2015 | Zhu | ..................... | H05B 45/325 | 363/21.16 |
| 2015/0280584 A1* | 10/2015 | Gong | ............... | H02M 3/33592 | 363/21.13 |
| 2015/0311810 A1* | 10/2015 | Chen | ................. | H02M 3/33515 | 363/21.13 |
| 2015/0326129 A1* | 11/2015 | Lin | .................. | H02M 3/33507 | 363/21.12 |
| 2015/0340957 A1* | 11/2015 | Fang | .................... | H05B 45/385 | 363/21.16 |
| 2016/0226239 A1* | 8/2016 | Yang | ...................... | H02H 7/125 | |
| 2016/0336864 A1* | 11/2016 | Fang | ................ | H02M 3/33507 | |
| 2017/0264202 A1* | 9/2017 | Finkel | .............. | H02M 3/33515 | |
| 2018/0062527 A1* | 3/2018 | Lu | ............................ | H02M 3/18 | |
| 2019/0348910 A1* | 11/2019 | Chou | ..................... | H02M 1/44 | |
| 2020/0212811 A1* | 7/2020 | Lin | .................. | H02M 3/33507 | |
| 2021/0006168 A1 | 1/2021 | Saes | | | |
| 2023/0344359 A1* | 10/2023 | Yeh | ..................... | H02M 1/0009 | |
| 2024/0120846 A1* | 4/2024 | Chen | .................. | H02M 3/33571 | |
| 2024/0128876 A1* | 4/2024 | Chen | .................. | H02M 1/0064 | |

* cited by examiner

700

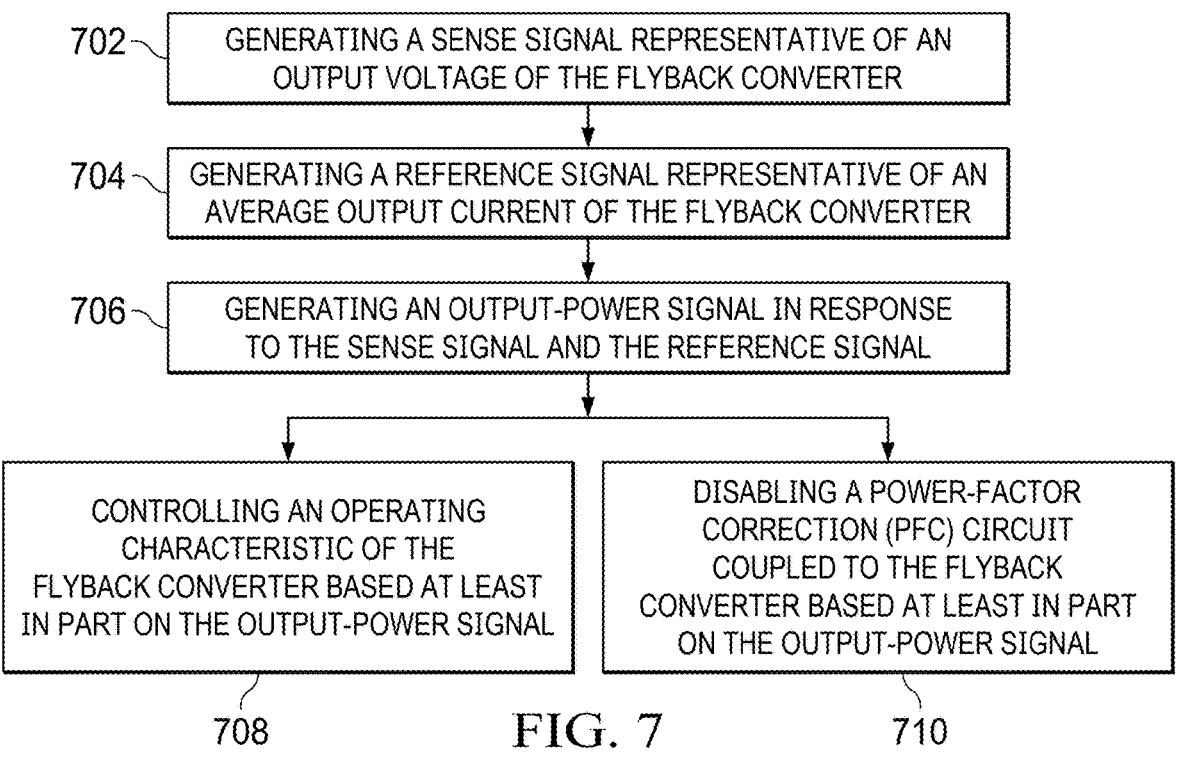

702 — GENERATING A SENSE SIGNAL REPRESENTATIVE OF AN OUTPUT VOLTAGE OF THE FLYBACK CONVERTER

704 — GENERATING A REFERENCE SIGNAL REPRESENTATIVE OF AN AVERAGE OUTPUT CURRENT OF THE FLYBACK CONVERTER

706 — GENERATING AN OUTPUT-POWER SIGNAL IN RESPONSE TO THE SENSE SIGNAL AND THE REFERENCE SIGNAL

CONTROLLING AN OPERATING CHARACTERISTIC OF THE FLYBACK CONVERTER BASED AT LEAST IN PART ON THE OUTPUT-POWER SIGNAL

DISABLING A POWER-FACTOR CORRECTION (PFC) CIRCUIT COUPLED TO THE FLYBACK CONVERTER BASED AT LEAST IN PART ON THE OUTPUT-POWER SIGNAL

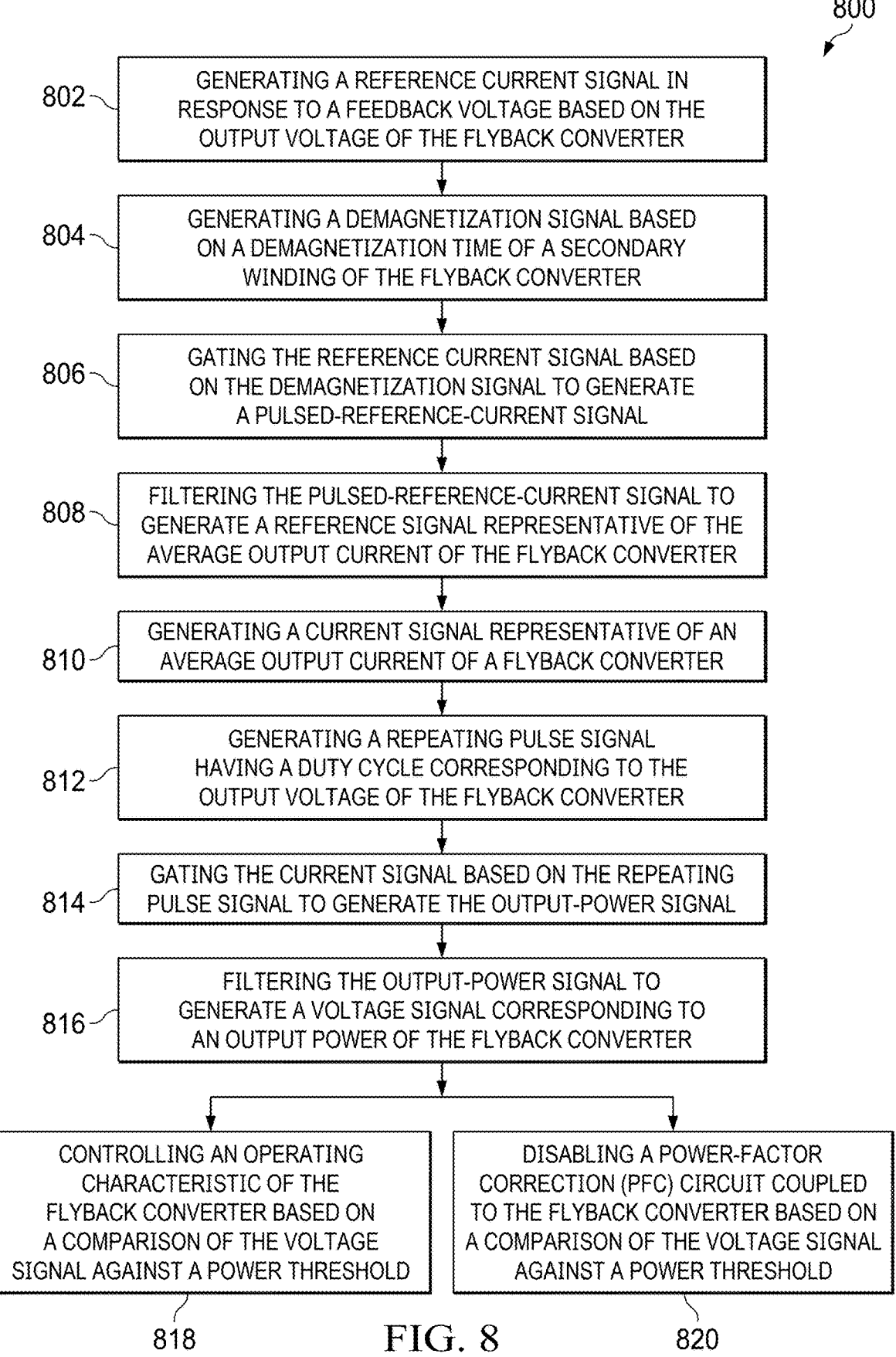

802 — GENERATING A REFERENCE CURRENT SIGNAL IN RESPONSE TO A FEEDBACK VOLTAGE BASED ON THE OUTPUT VOLTAGE OF THE FLYBACK CONVERTER

804 — GENERATING A DEMAGNETIZATION SIGNAL BASED ON A DEMAGNETIZATION TIME OF A SECONDARY WINDING OF THE FLYBACK CONVERTER

806 — GATING THE REFERENCE CURRENT SIGNAL BASED ON THE DEMAGNETIZATION SIGNAL TO GENERATE A PULSED-REFERENCE-CURRENT SIGNAL

808 — FILTERING THE PULSED-REFERENCE-CURRENT SIGNAL TO GENERATE A REFERENCE SIGNAL REPRESENTATIVE OF THE AVERAGE OUTPUT CURRENT OF THE FLYBACK CONVERTER

810 — GENERATING A CURRENT SIGNAL REPRESENTATIVE OF AN AVERAGE OUTPUT CURRENT OF A FLYBACK CONVERTER

812 — GENERATING A REPEATING PULSE SIGNAL HAVING A DUTY CYCLE CORRESPONDING TO THE OUTPUT VOLTAGE OF THE FLYBACK CONVERTER

814 — GATING THE CURRENT SIGNAL BASED ON THE REPEATING PULSE SIGNAL TO GENERATE THE OUTPUT-POWER SIGNAL

816 — FILTERING THE OUTPUT-POWER SIGNAL TO GENERATE A VOLTAGE SIGNAL CORRESPONDING TO AN OUTPUT POWER OF THE FLYBACK CONVERTER

CONTROLLING AN OPERATING CHARACTERISTIC OF THE FLYBACK CONVERTER BASED ON A COMPARISON OF THE VOLTAGE SIGNAL AGAINST A POWER THRESHOLD

818

DISABLING A POWER-FACTOR CORRECTION (PFC) CIRCUIT COUPLED TO THE FLYBACK CONVERTER BASED ON A COMPARISON OF THE VOLTAGE SIGNAL AGAINST A POWER THRESHOLD

SYSTEM AND METHOD FOR CALCULATING THE OUTPUT POWER OF A FLYBACK CONVERTER

TECHNICAL FIELD

The disclosure relates generally to power converters, and particularly to calculating the output power of a flyback converter.

BACKGROUND

Switching power converters can be used to create a direct current ("DC") voltage from an alternating current ("AC") voltage by switching current through a magnetic element such as an inductor or a transformer. Offline converters receive a voltage from an AC source or mains and form a first voltage, which may then be converted into a different voltage. Typically, an AC input voltage is converted into a full-wave rectified voltage by a diode bridge rectifier and smoothed before being converted into a lower voltage for use by low-voltage circuitry.

In some instances, multiple switching power converters may be used together to generate a low-voltage supply. For example, a first switching power converter stage including a power factor correction (PFC) circuit may be utilized in combination with a second switching power converter stage including a flyback converter. The PFC circuit may be used to ensure that power is being efficiently delivered to a load with a high power factor by keeping the current drawn from the AC source in phase with the AC voltage. The flyback converter may take the intermediate output voltage of the PFC circuit and convert it to a lower voltage that may be used by low-voltage circuitry. The inventors of embodiments of the present disclosure have recognized that the efficiency of a multi-stage switching power converter may be improved by disabling the PFC circuit in the first stage, or by changing the operating characteristics of the flyback converter in the second stage, during light load conditions when the output power delivered by the multi-stage power converter is low. The inventors of embodiments of the present disclosure have also recognized that traditional techniques for detecting output power on the secondary side of a flyback converter and communicating the output power back to the primary side of the flyback converter requires additional components, increasing the cost and complexity of the switching power converter. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

FIG. 7 illustrates a method for operating a switching power converter in accordance with embodiments of the present disclosure.

FIG. 8 illustrates a method for operating a switching power converter in accordance with embodiments of the present disclosure.

DETAILED DESCRIPTION

Details of one or more embodiments are set forth in the description below and the accompanying drawings. Other features will be apparent from the description, drawings, and from the claims.

Figure 1:
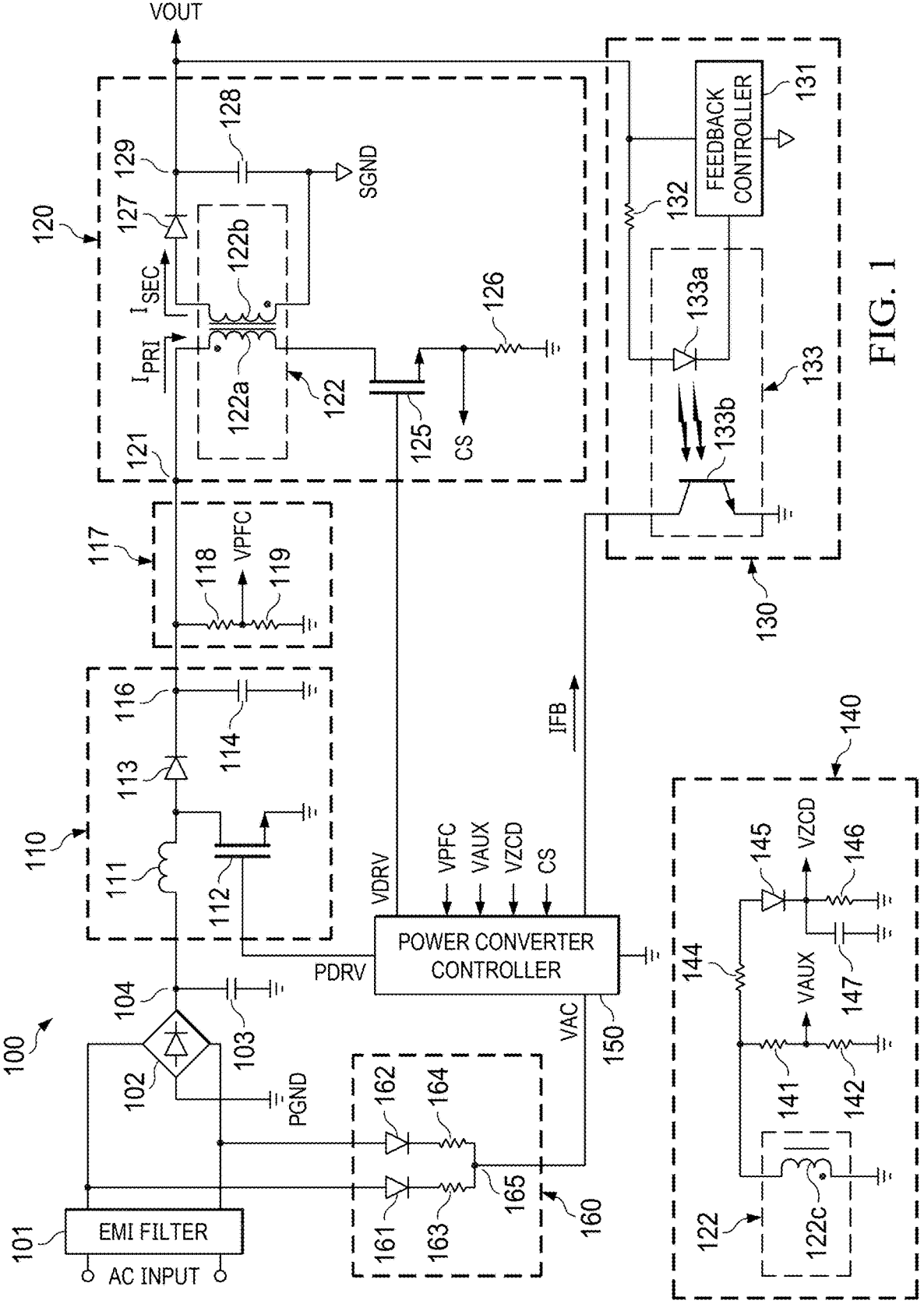
FIG. 1 illustrates a schematic diagram of a switching power converter in accordance with embodiments of the present disclosure.

FIG. 1 illustrates a schematic diagram of switching power converter 100 in accordance with embodiments of the present disclosure. Switching power converter 100 may be implemented in any suitable fashion according to the operation described in the present disclosure. In some embodiments, switching power converter 100 may include EMI filter 101, diode bridge 102, input capacitor 103, PFC circuit 110, resistor divider 117, flyback converter 120, feedback circuit 130, auxiliary circuit 140, power converter controller 150, and rectifier 160. As shown in FIG. 1, switching power converter 100 may in some embodiments be a multi-stage switching power converter with PFC circuit 110 serving as a first stage and flyback converter 120 serving as a second stage of the multi-stage power converter. Switching power converter 100 may be configured to receive an unregulated AC input voltage and may provide a regulated DC output voltage VOUT to a load.

The AC input for switching power converter 100 may pass through EMI filter 101 to diode bridge 102. EMI filter 101 may filter high-frequency AC noise. EMI filter 101 may, for example, protect switching power converter 100 from high-frequency noise on the AC line voltage received at the AC input. EMI filter 101 may also protect the AC line from high-frequency switching noise generated by switching power converter 100. Diode bridge 102 may receive the filtered AC line voltage and output a rectified DC voltage. An input capacitor 103 may be coupled across the output of diode bridge 102 at node 104. A rectified voltage may thus be established across input capacitor 103. As shown in FIG. 1, the voltage at input capacitor 103 may be provided to the input of PFC circuit 110.

PFC circuit 110 may be implemented in any suitable fashion according to the operation described in the present disclosure. As shown in FIG. 1, PFC circuit 110 may in some embodiments be implemented with a boost converter topology. For example, PFC circuit 110 may include inductor 111, switch 112, diode 113, and bulk capacitor 114. Switch 112 may be switched on and off repeatedly to convert the voltage at input capacitor 103 into a regulated PFC output voltage at PFC output 116. When switch 112 is switched on, the inductor current may flow through inductor 111 and switch 112 to the primary-side ground PGND. During the on-time of switch 112, the inductor current may increase over time. When switch 112 is switched off, the inductor current may flow through inductor 111 and diode 113 and to bulk capacitor 114. During the off-time of switch 112, the inductor current may decrease over time. To distinguish switch 112 of PFC circuit 110 from switch 125 of flyback converter 120, switch 112 of PFC circuit 110 may also be referred to as a PFC switch or PFC switch 112 for the purposes of the present disclosure.

The switching on and off of switch 112 may be controlled by a PFC drive signal PDRV provided by power converter controller 150. The PFC drive signal PDRV may drive switch 112 in a manner such that the current drawn from the AC source is in phase with the AC voltage, thereby ensuring that power delivered to flyback converter 120, and ultimately to a load coupled to the output of flyback converter 120, has a high power factor.

Although FIG. 1 illustrates that switch 112 may in some embodiments be an n-channel metal-oxide semiconductor field effect transistor ("NMOS transistor" or "N-channel MOSFET"), switch 112 may be implemented by any suitable type of switch or transistor. Moreover, although the example embodiment of PFC circuit 110 shown in FIG. 1 includes inductor 111, other embodiments may utilize any other suitable magnetic element, such as a first winding of a transformer or a first winding of a pair of coupled windings. Further, although FIG. 1 illustrates PFC circuit 110 as having a boost-type switching power converter topology, other embodiments of PFC circuit 110 may utilize other types of switching power converter topologies, such as a buck topology.

As shown in FIG. 1, switching power converter 100 may also include resistor divider 117. In some embodiments, resistor divider 117 may include resistor 118 and resistor 119 coupled between PFC output 116 of PFC circuit 110 and primary-side ground PGND. The intermediate node between resistor 118 and resistor 119 may thus provide a voltage signal VPFC proportional to the output voltage of PFC circuit 110. As described below with reference to FIG. 3, VPFC may be utilized by PFC control circuit 310 within power converter controller 150 to control PDRV. And as also described below with reference to FIG. 3, VPFC may also be utilized by power detector 330 within power converter controller 150.

As also shown in FIG. 1, switching power converter 100 may include rectifier 160. Rectifier 160 may include diode 161 and resistor 163 coupled in series between a first output of EMI filter 101 and node 165, and may also include diode 162 and resistor 164 coupled in series between a second output of EMI filter 101 and node 165. Rectifier 160 may thus generate a full wave rectified signal VAC corresponding to the AC voltage at the AC input. As described below with reference to FIG. 3, VAC may be utilized by PFC control circuit 310 within power converter controller 150 to control PDRV.

As shown in FIG. 1, the flyback input 121 may be coupled to PFC output 116. Accordingly, the PFC output voltage may serve as the input voltage for flyback converter 120. Although FIG. 1 illustrates switching power converter 100 as a multi-stage switching power converter with PFC circuit 110 serving as a first stage and flyback converter 120 serving as a second stage, switching power converter 100 may also be implemented in some embodiments without PFC circuit 110. In such embodiments, the flyback input 121 may be coupled directly to node 104 at the output of diode bridge 102. Moreover, in such embodiments, resistor divider 117 may remain coupled to flyback input 121 in order to provide a voltage signal proportional to the input voltage of flyback converter 120.

Flyback converter 120 may be implemented in any suitable fashion according to the operation described in the present disclosure. In some embodiments, flyback converter 120 may include transformer 122, switch 125, current-sense resistor 126, diode 127, and output capacitor 128. Transformer 122 may include primary winding 122a and secondary winding 122b. In some embodiments, transformer 122 may also include auxiliary winding 122c as described in further detail below with reference to auxiliary circuit 140. Transformer 122 may provide galvanic isolation between circuitry located on the primary side of transformer 122 and other circuitry located on the secondary side of transformer 122. For the purposes of the present disclosure, components of switching power converter 100 referenced to primary-side ground PGND or otherwise electrically coupled on the primary side of transformer 122, may be referred to as being located on the primary side of flyback converter 120. And, for the purposes of the present disclosure, components of switching power converter 100 referenced to secondary-side ground SGND or otherwise electrically coupled on the secondary side of transformer 122, may be referred to as being located on the secondary side of flyback converter 120.

Switch 125 may be switched on and off repeatedly to convert the input voltage at flyback input 121 into a regulated output voltage VOUT at output 129. Although FIG. 1 illustrates that switch 125 may in some embodiments be an NMOS transistor, switch 125 may be implemented by any suitable type of switch or transistor. As described in further detail below with reference to power converter controller 150 and flyback control circuit 320, the switching on and off of switch 125 may be controlled by a flyback drive signal VDRV provided by flyback control circuit 320.

Figure 2:
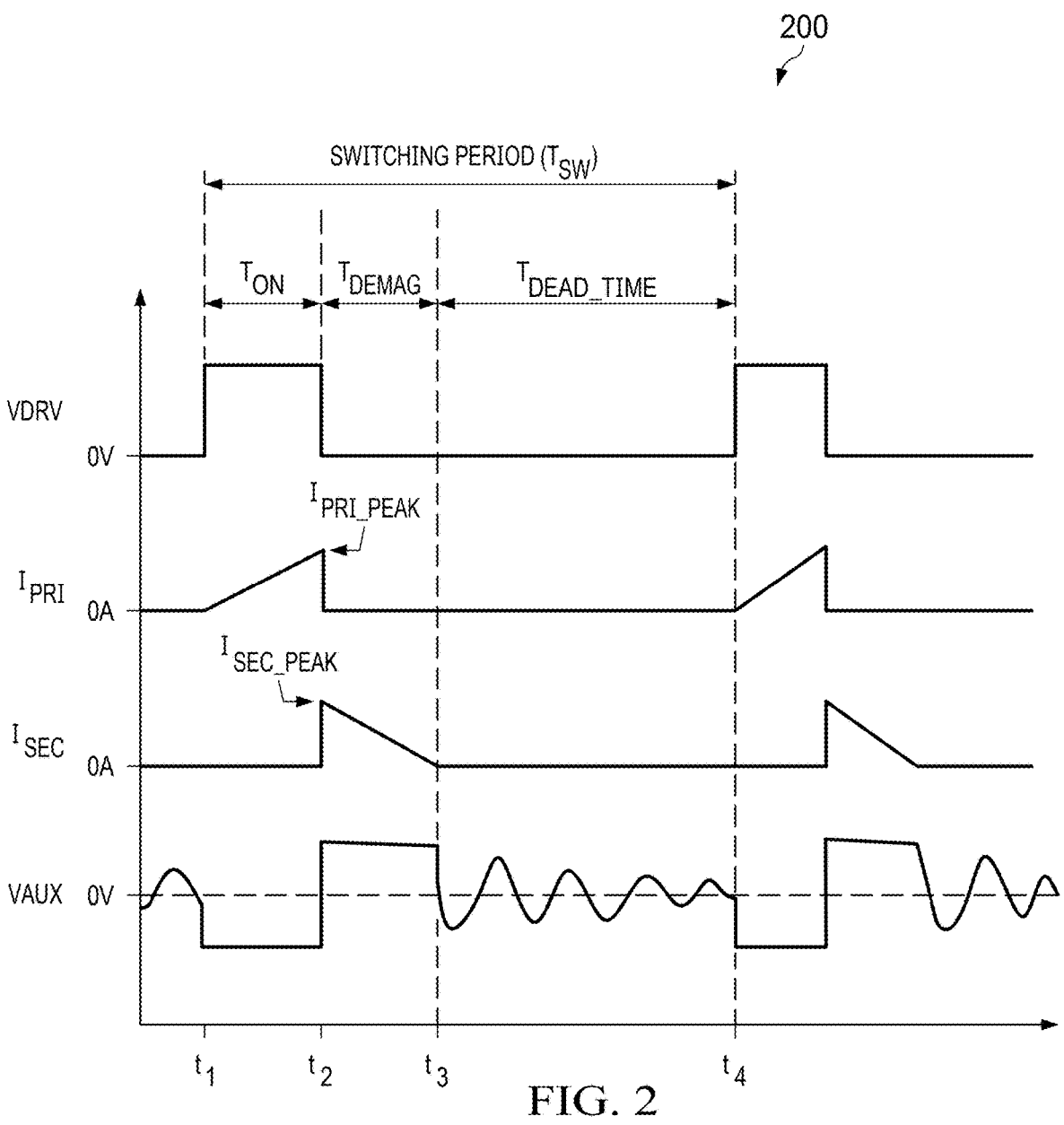
FIG. 2 illustrates a plot diagram of example waveforms within a flyback converter in accordance with embodiments of the present disclosure.

FIG. 2 illustrates a plot diagram of example waveforms within flyback converter 120 in accordance with embodiments of the present disclosure. As shown in FIG. 2, the flyback drive signal VDRV may be asserted high to turn on switch 125 between times t1 and t2. During the on-time of switch 125 between times t1 and t2, a primary-winding current $I_{PRI}$ may flow from flyback input 121, through primary winding 122a, switch 125, and current-sense resistor 126, and to primary-side ground PGND. And as shown in FIG. 2, during the on-time of switch 125, the primary-winding current $I_{PRI}$ may increase over time as the magnetic flux stored by transformer 122 increases. During the on-time of switch 125, the current-sense resistor 126 may provide a current-sense signal CS in the form of a voltage proportional to the primary-winding current $I_{PRI}$ flowing through switch 125 and current-sense resistor 126 to primary-side ground PGND.

When switch 125 is switched-off, the primary-winding current $I_{PRI}$ may end and a secondary-winding current $I_{SEC}$ may begin. The secondary-winding current $I_{SEC}$ may flow from secondary-side ground SGND, through secondary winding 122b and diode 127, and to output capacitor 128 at output 129. And as shown in FIG. 2, during the off-time of switch 125, the secondary-winding current $I_{SEC}$ may decrease over time between times t2 and t3 as the magnetic flux stored by transformer 122 dissipates. For the purposes of the present disclosure, the time period from time t2 to time t3 during which $I_{SEC}$ may decrease to zero may also be referred to as the demagnetization time or the demagnetization period.

Although FIG. 1 illustrates flyback converter 120 implemented with diode 127 to rectify the current flowing through the secondary side, flyback converter 120 may also be implemented with any suitable rectifier configured to block current flowing in the secondary side during the on-time of switch 125, and to allow current to flow through secondary winding 122*b* and to output capacitor 128 during the off-time of switch 125. For example, flyback converter 120 may in some embodiments be configured with a synchronous rectifier in the form of an NMOS transistor that is coupled between secondary-side ground SGND and secondary winding 122*b* and that is driven in an off-state during the on-time of switch 125 and driven in an on-state during the demagnetization time.

As shown in FIG. 1, switching power converter 100 may also include feedback circuit 130 to provide to power converter controller 150 a feedback signal IFB based on the difference between the output voltage VOUT and the desired value for the output voltage VOUT. Feedback circuit 130 may be implemented in any suitable fashion according to the operation described in the present disclosure. In some embodiments, feedback circuit 130 may include feedback controller 131, resistor 132, and optocoupler 133. Feedback controller 131 may utilize optocoupler 133 to transmit feedback representative of the regulated output voltage VOUT on the secondary side of flyback converter 120 to power converter controller 150 located on the primary side of flyback converter 120 while maintaining the galvanic isolation between the primary side of flyback converter 120 and the second side of flyback converter 120.

Optocoupler 133 may include light-emitting diode (LED) 133*a* and photo-transistor 133*b*. Feedback controller 131 may pull a current through resistor 132 and LED 133*a* based on the voltage level of VOUT. Based on the current through LED 133*a*, LED 133*a* may transmit a light signal to photo-transistor 133*b*, which may in turn provide a feedback signal IFB in the form of a current pulled from power converter controller 150.

As described in further detail below with reference to power converter controller 150, the feedback signal IFB may be converted from a current into a feedback voltage VFB, and flyback control circuit 320 may utilize the feedback voltage VFB to control the flyback drive signal VDRV. In some embodiments, feedback controller 131 may dynamically select different output voltage VOUT settings and may scale the amount of current pulled through LED 133*a* based on the selected voltage level for VOUT. For example, feedback controller 131 may dynamically set the output voltage VOUT to any one of a plurality of settings, including for example 5 V, 9 V, 12 V, 15 V, or 20 V. In such embodiments, feedback controller 131 may scale the amount of current pulled through LED 133*a* based on the selected one of the plurality of output voltage settings. The regulated output voltage VOUT of flyback converter 120 may thus be dynamically changed according to the scaling provided by feedback controller 131.

As shown in FIG. 1, switching power converter 100 may also include auxiliary circuit 140. Auxiliary circuit 140 may be implemented in any suitable fashion according to the operation described in the present disclosure. In some embodiments, auxiliary circuit 140 may include auxiliary winding 122*c* of transformer 122, resistors 141 and 142, as well as resistor 144, diode 145, resistor 146, and capacitor 147.

Auxiliary circuit 140 may be configured to reflect various operating parameters on the secondary side of flyback converter 120. For example, during the demagnetization time when the secondary-winding current $I_{SEC}$ is flowing on the secondary side, auxiliary winding 122*c* may reflect the voltage across secondary winding 122*b*. The voltage across secondary winding 122*b* during this time may be equal to the output voltage VOUT minus the voltage drop across diode 127. In embodiments that use a synchronous rectifier in place of diode 127, the voltage across secondary winding during this time may be equal to the output voltage minus the voltage drop across the synchronous rectifier. Thus, accounting for the voltage drop across diode 127 (or across a different rectifier used in place of diode 127), the voltage reflected by auxiliary winding 122*c* may be utilized to detect VOUT.

As shown in FIG. 1, resistors 141 and 142 may form a resistor divider that may provide a voltage VAUX proportional to the voltage across auxiliary winding 122*c*. Thus, accounting for the voltage drop across diode 127 (or across a different rectifier used in place of diode 127), VAUX may be used to detect VOUT during the demagnetization time when the secondary-winding current $I_{SEC}$ is flowing on the secondary side. For example, as shown in FIG. 2, VAUX may have a voltage proportional to VOUT (accounting for the voltage drop across diode 127 or other rectifier) during the demagnetization time from time t2 to time t3. As described in further detail below with reference to FIG. 4, power detector 330 may utilize VAUX to detect the actual output voltage VOUT for the purposes of calculating output power.

Auxiliary circuit 140 may further be used to detect the end of the demagnetization time when the secondary-winding current $I_{SEC}$ reaches zero. Referring back to FIG. 2, the secondary-winding current $I_{SEC}$ will decrease over time from time t2 to time t3. When secondary-winding current $I_{SEC}$ reaches zero at time t3, the voltage across auxiliary winding 122*c* may drop sharply and begin to oscillate until the VDRV is asserted high again to turn on switch 125. Auxiliary circuit 140 may be used in conjunction with zero-cross detection circuitry within power converter controller 150 to detect when secondary-winding current $I_{SEC}$ reaches zero. For example, auxiliary circuit 140 may include resistor 144, diode 145, and resistor 146 coupled between auxiliary winding 122*c* and primary-side ground PGND. Capacitor 147 may be further coupled in parallel with resistor 146. A zero-cross detection voltage VZCD may thus be developed across resistor 146 and capacitor 147. As described in further detail below with reference to FIG. 3, VZCD may be utilized by flyback control circuit 320 within power converter control 150 to detect the first valley of the oscillation reflected by auxiliary winding 122*c* indicating that the secondary-winding current $I_{SEC}$ has reached zero and the demagnetization time has ended, as well as subsequent valleys of the oscillation reflected by auxiliary winding 122*c*. Although VAUX and VZCD are shown as different signals in the example embodiment illustrated in FIG. 1, in some embodiments both the output voltage VOUT and the valleys of the oscillation reflected by auxiliary winding 122*c* after the demagnetization time has ended may be detected based on a single signal, such as VZCD, generated based on the voltage of auxiliary winding 122*c* at different times during a switching cycle.

As shown in FIG. 1, power converter controller 150 may receive various inputs for providing the PDRV signal to drive switch 112 of PFC circuit 110 and for providing the VDRV signal to drive switch 125 of flyback converter 120. In some embodiments, some or all of the components of power converter controller 150 may be included in monolithic integrated circuit. In some embodiments, other components of switching power converter 100, such as switch 112 and switch 125, may be implemented on the same monolithic integrated circuit as some or all of the components of power converter controller 150. In other embodiments, components of power converter controller 150 as well as other components of switching power converter 100 such as switch 112 and switch 125, may be implemented on more than one integrated circuit die, and co-packaged together in a single multi-die integrated circuit package.

Figure 3:
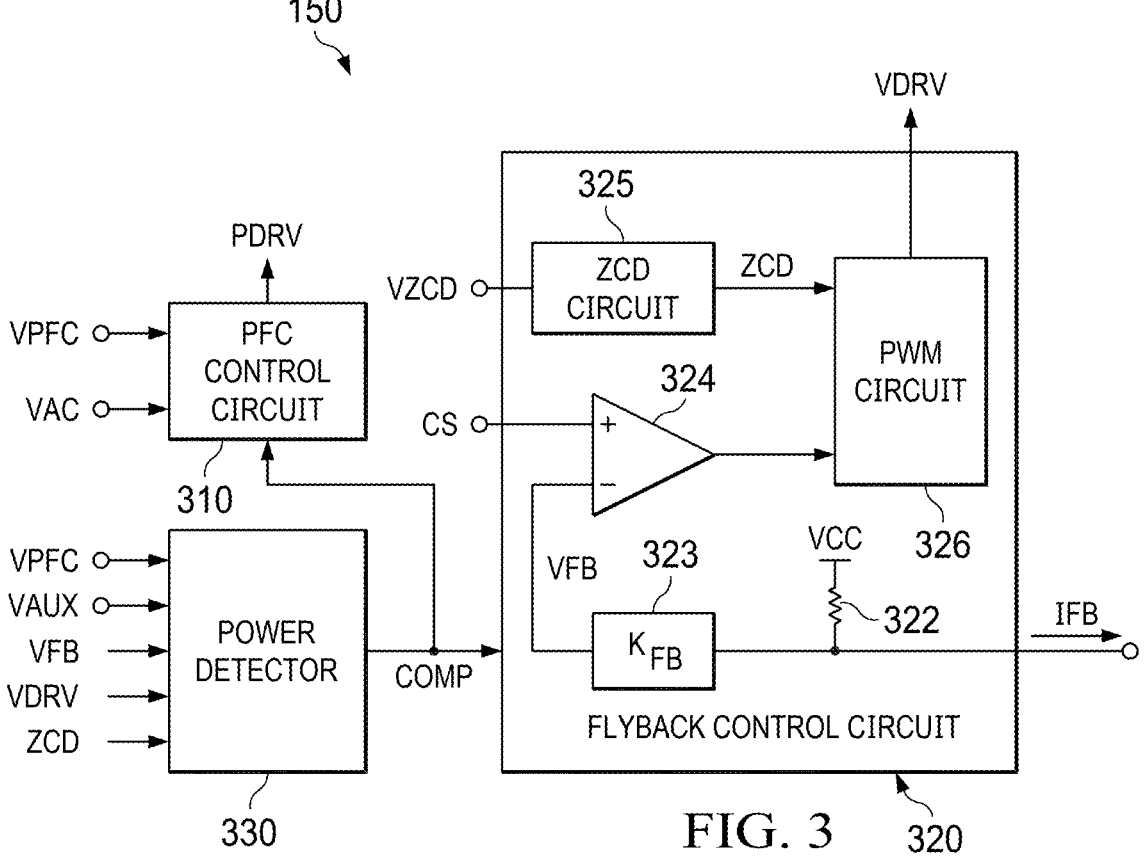
FIG. 3 illustrates a schematic diagram of a power converter controller in accordance with embodiments of the present disclosure.

FIG. 3 illustrates a schematic diagram of power converter controller 150 in accordance with embodiments of the present disclosure. Power converter controller 150 may be implemented in any suitable fashion according to the operation described in the present disclosure. In some embodiments, power converter controller 150 may include PFC control circuit 310, flyback control circuit 320, and power detector 330. As shown in FIG. 1, power converter controller 150 may be configured to be located on the primary side of flyback converter 120. Thus, each of PFC control circuit 310, flyback control circuit 320, and power detector 330 may be configured to be located on the primary side of flyback converter 120.

PFC control circuit 310 may be configured to provide the PDRV signal for driving switch 112 of PFC circuit 110. PFC control circuit 310 may be implemented in any suitable fashion according to the operation described in the present disclosure. For example, PFC control circuit 310 may receive the full wave rectified signal VAC as well as feedback from the output of PFC circuit 110 in the form of VPFC. Based at least in part on VAC and VPFC, PFC control circuit 310 may generate the PDRV signal to drive the gate of switch 112 of PFC circuit 110. PFC control circuit 310 may drive switch 112 on and off in a manner such that the current drawn from the AC input is in phase with the AC voltage at the AC input of switching power converter 100. Accordingly, PFC control circuit 310 may, in conjunction with PFC circuit 110, ensure that switching power converter 100 maintains a high power factor.

Flyback control circuit 320 may be configured to control switch 125 of flyback converter 120. For example, flyback control circuit 320 may provide the VDRV signal for driving switch 125 of flyback converter 120. Flyback control circuit 320 may be implemented in any suitable fashion according to the operation described in the present disclosure. In some embodiments, flyback control circuit 320 may include resistor 322, gain stage 323, comparator 324, ZCD circuit 325, and pulse-width modulation (PWM) circuit 326.

As described above with reference to FIG. 1, optocoupler 133 of feedback circuit 130 may provide a feedback signal IFB to power converter controller 150. The feedback signal IFB may be provided to resistor 322 of flyback control circuit 320, which may be coupled between an internal voltage supply rail VCC and optocoupler 133. Accordingly, resistor 322 may convert the current of feedback signal IFB into a voltage. In turn, gain stage 323 may apply a gain K to the voltage across resistor 322 and may accordingly generate a feedback voltage VFB. The feedback voltage VFB may represent the error between the output voltage VOUT and the desired value of the output voltage according to the scaling provided by feedback controller 131.

In some embodiments, flyback control circuit 320 may be configured as a peak-current mode quasi-resonant controller. Accordingly, the on-time of switch 125 may be determined based on a comparison between the feedback voltage VFB and the current-sense signal CS. As shown in FIG. 3, comparator 324 may receive the feedback voltage VFB at a first input terminal and a the current-sense signal CS at a second input terminal. When the primary-winding current $I_{PRI}$ flowing through switch 125 and current-sense resistor 126 rises to a level during the on-time of switch 125 such that the voltage level of the current-sense signal CS reaches the voltage level of the feedback voltage VFB, comparator 324 may instruct PWM circuit 326 to drive VDRV low to turn switch 125 off.

In a quasi-resonant control scheme, switch 125 may be held in an off-state until the oscillation present at the drain of switch 125 after the end of the demagnetization time is in a valley. For example, to reduce the switching loss associated with turning on switch 125 at the beginning of the next switching cycle, switch 125 may be turned back on during a low-point of the voltage at the drain of switch 125. Referring back to FIG. 2, the oscillation of VAUX based on auxiliary winding 122*c* starting at time t3 will mirror the oscillation at the drain of switch 125, which is coupled to primary winding 122*a*. ZCD circuit 325 may monitor the VZCD signal from auxiliary circuit 140 to determine when the voltage across auxiliary winding 122*c*, and thus also the voltage at the drain of switch 125, reaches the valleys of the oscillation after time t3. ZCD circuit 325 may provide a zero-cross signal ZCD to PWM circuit 326 to indicate the time of the first valley after the secondary-winding current $I_{SEC}$ has reached zero and the demagnetization time has ended, as well as subsequent valleys of the oscillation. PWM circuit 326 may then drive VDRV high to turn switch 125 back on to begin the next switching cycle in alignment with one of the valleys of the oscillation. Depending on load conditions and the desired duty cycle and switching frequency to regulate VOUT, PWM circuit 326 may choose to turn on switch 125 at any of the first, second, third, or subsequent valleys. Although the example embodiment shown in FIG. 3 illustrates ZCD circuit 325 monitoring the VZCD signal from auxiliary circuit 140 to indirectly determine the timing of the valleys at the drain of switch 125, ZCD circuit 325 may, in some embodiments, directly monitor the voltage at the drain of switch 125, which is coupled to primary winding 122*a*.

As shown in FIG. 3, power converter controller 150 may also include power detector 330. Power detector 330 may be implemented in any suitable fashion according to the operation described in the present disclosure. For example, power detector 330 may receive various inputs, including VPFC, VAUX, VFB, VDRV, and ZCD, and may calculate the output power being delivered at the output of flyback converter 120. The output power may then be compared to an output power threshold to generate a comparison signal COMP. Depending on the status of the comparison signal COMP, power converter controller 150 may change the operating mode of one or both of PFC control circuit 310 and flyback control circuit 320.

For example, during light load conditions, when the power delivered at the output of switching power converter 100 is low, the power factor correction provided by PFC circuit 110 may be of limited benefit. Thus, during such low-power conditions, power detector 330 may utilize the COMP signal to instruct PFC control circuit 310 to disable PFC circuit 110. To disable PFC circuit 110, PFC control circuit 310 may drive PDRV continuously low, thereby holding switch 112 in an off-state. When switch 112 is held in an off-state, power may still flow through inductor 111 and diode 113 of PFC circuit 110 to flyback input 121 of flyback converter 120. Flyback converter 120 may thus continue to regulate the output voltage VOUT. The efficiency of switching power converter 100 may be improved during such low-power conditions by saving the switching loss associated with repeatedly turning switch 112 on and off.

As another example, during light load conditions, when the power delivered at the output of switching power converter 100 is low, the efficiency of flyback converter 120 may be improved by operating at a lower switching frequency to reduce switching losses that are proportional to the switching frequency. Thus, during such low-power conditions, power detector 330 may utilize the COMP signal to inform flyback control circuit 320 of the low-power condition. As described above with reference to the quasi-resonant control scheme of flyback control circuit 320, PWM circuit 326 may select a valley of the oscillation at the drain of switch 125 during the off-time of switch 125 at which to turn switch 125 back on to begin the next switching cycle. Thus, to reduce the switching frequency in response to the COMP signal indicating a low-power condition, flyback control circuit 320 may instruct PWM circuit 326 to select a later valley in response to the COMP signal than would otherwise be selected during normal or high output-power conditions.

Figure 4:
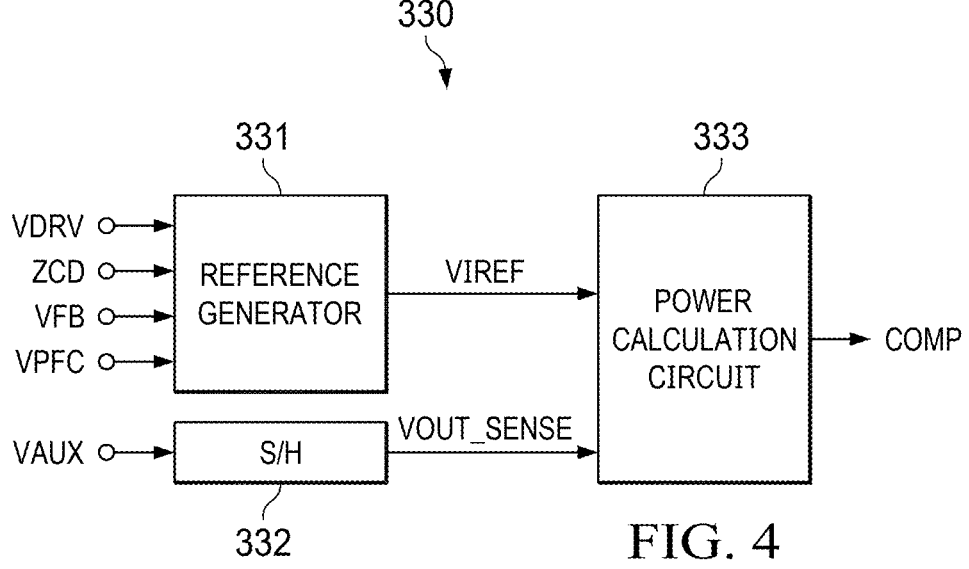
FIG. 4 illustrates a block diagram of a power detector in accordance with embodiments of the present disclosure.

FIG. 4 illustrates a block diagram of a power detector 330 in accordance with embodiments of the present disclosure. Power detector 330 may be implemented in any suitable fashion according to the operation described in the present disclosure. In some embodiments, power detector 330 may include reference generator 331, sense circuit 332, and power calculation circuit 333. Power detector 330 and its internal components may be located on the primary side of flyback converter 120. Thus, for the purposes of the present disclosure, power detector 330 may also be referred to as a primary-side power detector. Moreover, for the purposes of the present disclosure, reference generator 331 may also be referred to as a primary-side reference generator, sense circuit 332 may also be referred to as a primary-side sense circuit, and power calculation circuit 333 may also be referred to as a primary-side power calculation circuit.

As described in further detail below with reference to FIGS. 5A and 5B, reference generator 331 may in some embodiments receive the VDRV, ZCD, VFB, and VPFC signals as inputs, and may use those inputs to generate a reference signal VIREF representative of an average output current of flyback converter 120.

Sense circuit 332 may receive the VAUX signal as an input and may generate a sense signal VOUT_SENSE representative of the output voltage VOUT of flyback converter 120. As described above with reference to auxiliary circuit 140 shown in FIG. 1, the VAUX signal may reflect the voltage across secondary winding 122b of transformer 122 during the demagnetization time when the secondary-winding current $I_{SEC}$ is flowing in the secondary side of flyback converter 120. The voltage across the secondary-winding during this time is equal to the output voltage VOUT of flyback converter 120 minus the voltage drop across diode 127 (or across a different rectifier used in place of diode 127). Thus, the VAUX signal may be utilized to detect the output voltage VOUT. Sense circuit 332 may include sample-and-hold circuitry that may sample VAUX during a time within the demagnetization period when the secondary-winding current $I_{SEC}$ is flowing in the secondary side. The sample-and-hold circuitry may then hold that sampled voltage to during the remainder of the switching cycle and may output the sense signal VOUT_SENSE representative of the output voltage VOUT of flyback converter 120. For example, referring back to FIG. 2, the sample-and-hold circuitry of sense circuit 332 may sample VAUX toward the end of the demagnetization period between time t2 and t3 when the secondary-winding current $I_{SEC}$ is near zero. By sampling when $I_{SEC}$ is near zero, the impact of the voltage drop across diode 127 (or a different rectifier used in place of diode 127) on the voltage reflected by auxiliary winding 122c may be minimized, thus improving the accuracy with which VAUX and VOUT_SENSE may represent VOUT.

Power calculation circuit 333 may receive VIREF and VOUT_SENSE as inputs. VOUT_SENSE may be representative of the output voltage VOUT of the flyback converter 120. And as described below with reference to FIG. 5A, VIREF may be representative of an average output current of flyback converter 120. Thus, as described in further detail below with reference to FIG. 6, power calculation circuit 333 may use VIREF and VOUT_SENSE to determine the output power of flyback converter 120. And when the output power falls below a threshold, power calculation circuit 333 of power detector 330 may utilize the comparison signal COMP to disable the PFC circuit 110, change an operating characteristic of flyback converter 120, or both.

Figure 5A:
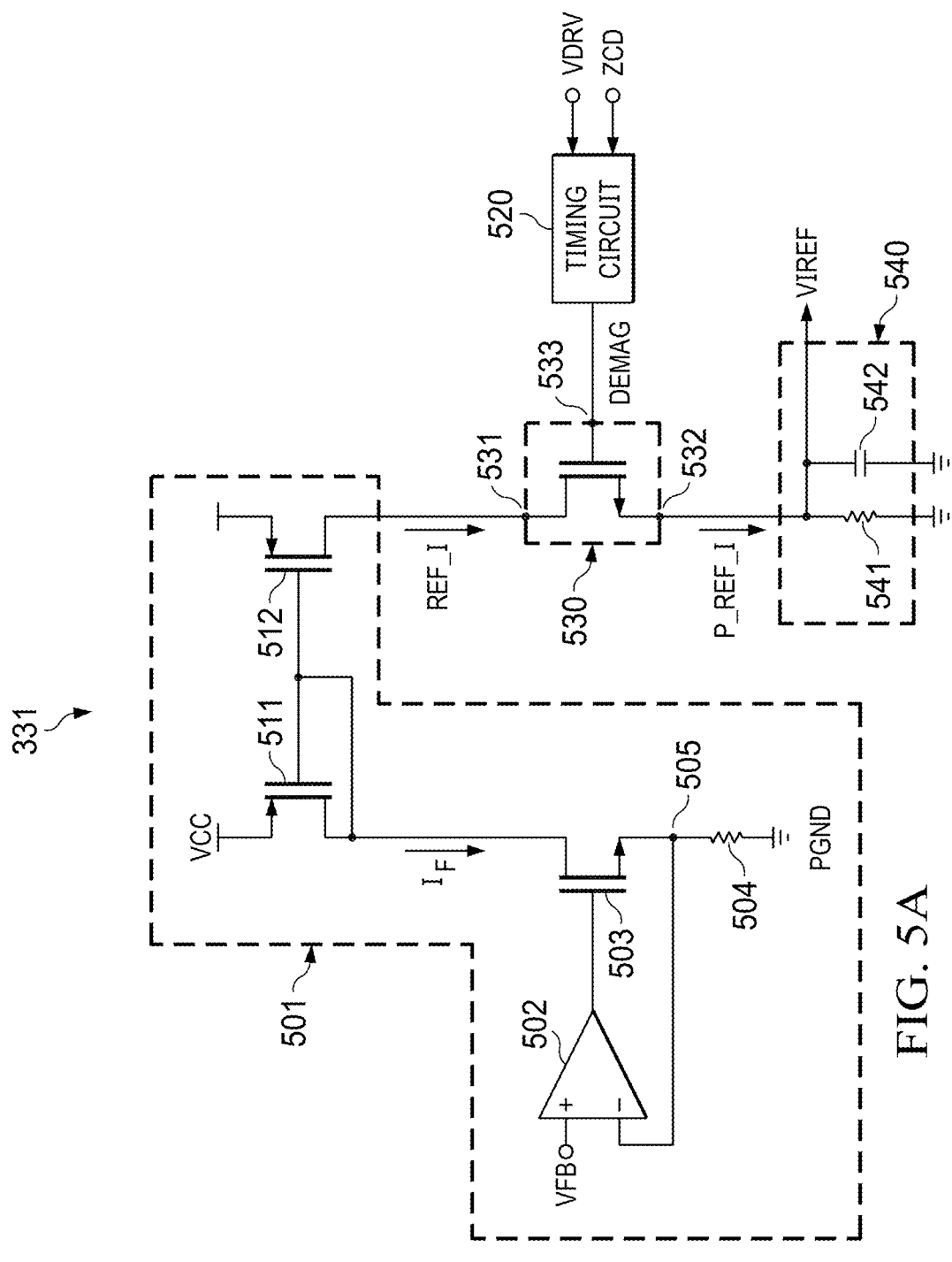
FIG. 5A illustrates a schematic diagram of a reference generator in accordance with embodiments of the present disclosure.

FIG. 5A illustrates a schematic diagram of reference generator 331 in accordance with embodiments of the present disclosure. Reference generator 331 may be implemented in any suitable fashion according to the operation described in the present disclosure. In some embodiments, reference generator 331 may include reference-current generator 501, timing circuit 520, reference-generator transistor 530, and reference-generator filter 540.

Reference-current generator 501 may be implemented in any suitable fashion according to the operation described in the present disclosure. Reference-current generator 501 may be configured to generate a reference current signal REF_I in response to the feedback voltage VFB that may be based on the output voltage of flyback converter 120. In some embodiments, reference-current generator 501 may include amplifier 502, transistor 503, resistor 504, and a current mirror formed by transistors 511 and 512. Amplifier 502 may have a positive input terminal coupled to receive the feedback voltage VFB and a negative input terminal coupled to receive feedback from node 505. The output of amplifier 502 may be coupled to the gate of transistor 503, which may be coupled in a source-follower configuration with its source coupled to node 505. In some embodiments, transistor 503 may be an NMOS transistor. Resistor 504 may be coupled between node 505 and primary-side ground PGND. Amplifier 502 may drive transistor 503 to cause the voltage at node 505 to be equal to the feedback voltage VFB. Accordingly, the current $I_F$ through transistor 503 may be equal to the feedback voltage VFB divided by the resistance of resistor 504.

The drain of transistor 503 may be coupled to the current mirror formed by transistors 511 and 512. In some embodiments, each of transistors 511 and 512 may be a p-channel metal-oxide semiconductor field effect transistor ("PMOS transistor" or "P-channel MOSFET"). Transistor 511 may have a drain coupled to the drain of transistor 503, and may thus receive the current $I_F$ equal to the feedback voltage VFB divided by the resistance of resistor 504. Transistor 511 may have a gate coupled to its drain, and a source coupled to VCC. Transistor 512 may have a gate coupled to the gate of transistor 511 and a source coupled to VCC. Transistor 512 may thus mirror the current $I_F$ from transistor 503. Reference-current generator 501 may thus generate the reference current signal REF_I based on the feedback voltage VFB and the resistance value of resistor 504.

As shown in FIG. 5A, timing circuit 520 may receive the drive signal VDRV and the zero-cross signal ZCD, and may generate a demagnetization signal DEMAG. Timing circuit 520 may be implemented in any suitable fashion according to the operation described in the present disclosure. For example, timing circuit 520 may be configured to generate the demagnetization signal DEMAG based on an end time of the drive signal VDRV for switch 125 of flyback converter 120 and a zero-cross signal ZCD indicating the secondary-winding current $I_{SEC}$ of transformer 122 has reached zero.

Referring back to FIG. 2, the demagnetization time may begin at time t2 when the drive signal VDRV goes low to turn off switch 125. Further, the demagnetization period may subsequently end at time t3, causing the voltage reflected by auxiliary winding 122c to drop sharply. As described above with reference to FIG. 3, ZCD circuit 325 may monitor auxiliary winding 122c and may provide a zero-cross signal ZCD indicating when the voltage across auxiliary winding 122c has dropped sharply at the end of the demagnetization time. Accordingly, timing circuit 520 may utilize the end time of the VDRV signal when VDRV transitions from high to low, to determine the beginning of the demagnetization period. Further, timing circuit 520 may utilize the zero-cross signal ZCD to determine the end of the demagnetization period. In response to the drive signal VDRV and the zero-cross signal ZCD, timing circuit 520 may thus generate a demagnetization signal DEMAG corresponding to the demagnetization time of secondary winding 122b of transformer 122.

As shown in FIG. 5A, reference-generator transistor 530 in reference generator 331 may be coupled to receive the reference current signal REF_I. In some embodiments, reference-generator transistor 530 may be an NMOS transistor.

Reference-generator transistor 530 may have a first conduction terminal 531 coupled to receive the reference current signal REF_I, a gate 533 coupled to receive a demagnetization signal DEMAG, and a second conduction terminal 532 configured to output a pulsed-reference-current signal P_REF_I based on the reference current signal REF_I and the demagnetization signal DEMAG. As described above with reference to timing circuit 520, the DEMAG signal may correspond to the demagnetization time of secondary winding 122b of transformer 122. Thus, the demagnetization signal DEMAG may drive the reference-generator transistor 530 in an on-state for a period corresponding to a demagnetization time of secondary winding 122b of transformer 122 of flyback converter 120. For example, when the demagnetization signal DEMAG is high, reference-generator transistor 530 may be driven in an on-state and may thus pass the reference current signal REF_I from its first conduction terminal 531 to its second conduction terminal 532. The second conduction terminal 532 may thus be configured to output the pulsed-reference-current signal P_REF_I based on the reference current signal REF_I and the demagnetization signal DEMAG.

As shown in FIG. 5A, reference-generator filter 540 in reference generator 331 may be coupled to receive the pulsed-reference-current signal P_REF_I. Reference-generator filter 540 may be implemented in any suitable fashion according to the operation described in the present disclosure. In some embodiments, reference-generator filter 540 may include resistor 541 and capacitor 542 coupled in parallel to each other and between the second conduction terminal 532 and primary-side ground PGND. As the pulsed-reference-current signal P_REF_I passes through resistor 541, resistor 541 may develop a voltage that is filtered by capacitor 542. Reference-generator filter 540 may thus produce the reference signal VIREF. As described below, the reference signal VIREF may be proportional to, and thus representative of, an average output current of flyback converter 120. Although reference-generator filter 540 is shown in the example embodiment of FIG. 5A as a first-order RC filter, reference-generator filter 540 may be implemented in any suitable fashion, including for example as a second-order RC filter.

Referring back to FIG. 1 and FIG. 2, the current delivered to the output of flyback converter 120 is the secondary-winding current $I_{PRI}$. As shown in FIG. 2, the secondary-winding current $I_{PRI}$ decreases linearly during the demagnetization time from time t2 to time t3. Thus, the average output current of flyback converter 120 can be expressed as follows:

$$\text{Avg. Output Current} = \frac{1}{2} I_{SEC\_PEAK} * (T_{DEMAG} / T_{SW}) \qquad \text{(Eq. 1)}$$

where $I_{SEC\_PEAK}$ is the peak value of the secondary-winding current $I_{SEC}$ at time t2, $T_{DEMAG}$ is the demagnetization time between times t2 and t3, and the $T_{SW}$ is the switching period of the full switching cycle from time t1 to time t4.

Further, due to the flyback configuration of flyback converter 120, the peak value of the secondary-winding current $I_{SEC}$ can be expressed in terms of the peak value of the primary-winding current $I_{PRI}$ as follows:

$$I_{SEC\_PEAK} = I_{PRI\_PEAK} * (N_{PRI} / N_{SEC}) \qquad \text{(Eq. 2)}$$

where $I_{PRI\_PEAK}$ is the peak value of the primary-winding current $I_{PRI}$ at time t2, and $N_{PRI}/N_{SEC}$ represents the winding ratio of primary winding 122a versus secondary winding 122b of transformer 122. Substituting Equation 2 into Equation 1, the average output current of flyback converter 120 can be expressed as follows:

$$\text{Avg. Output Current} = \frac{1}{2} I_{PRI\_PEAK} * (N_{PRI} / N_{SEC}) * (T_{DEMAG} / T_{SW}) \qquad \text{(Eq. 3)}$$

As described above with reference to FIG. 3, flyback control circuit 320 may be configured as a peak-current mode quasi-resonant controller. Accordingly, the on-time of switch 125 may be determined based on a comparison between the feedback voltage VFB and the current-sense signal CS. When the primary-winding current $I_{PRI}$ flowing through switch 125 and current-sense resistor 126 rises to a level during the on-time of switch 125 such that the voltage level of the current-sense signal CS reaches the voltage level of the feedback voltage VFB, comparator 324 may instruct PWM circuit 326 to drive VDRV low to turn switch 125 off. Accordingly, the feedback voltage VFB may be proportional to $I_{PRI\_PEAK}$. As such, the average output current of flyback converter 120 can be expressed as follows:

$$\text{Avg. Output Current} = \qquad \text{(Eq. 4)}$$
$$\frac{1}{2} (VFB / (R_{126} * K_{FB})) * (N_{PRI} / N_{SEC}) * (T_{DEMAG} / T_{SW})$$

where VFB is the feedback voltage received by comparator 324, $R_{126}$ is the resistance of current-sense resistor 126 shown in FIG. 1, and $K_{FB}$ is the gain factor applied to feedback signal by gain stage 323 to generate VFB as shown in FIG. 3. Equation 4 can then be simplified as follows:

$$\text{Avg. Output Current} = K * VFB * (T_{DEMAG} / T_{SW}) \qquad \text{(Eq. 5)}$$

where K is a constant accounting for the value of current-sense resistor 126, the gain factor $K_{FB}$ of gain stage 323, and the winding ratio ($N_{PRI}/N_{SEC}$) of primary winding 122a versus secondary winding 122b.

Returning back to FIG. 5A, reference-current generator 501 may generate the reference current signal REF_I in response to the feedback voltage VFB that may be based on the output voltage of the flyback converter. In particular, the reference current signal REF_I may be generated based on the voltage of feedback voltage VFB divided by the resistance of resistor 504. The reference current signal REF_I may thus be proportional to the feedback voltage VFB. Further, timing circuit 520 may drive reference-generator transistor 530 in an on-state for a period corresponding to the demagnetization time of secondary winding 122b during each switching period. Thus, the time-averaged value of the pulsed-reference-current signal P_REF_I may be proportional to the feedback voltage VFB times ratio of the demagnetization time versus the switching period. Thus, in accordance with Equation 5 above, by filtering the voltage produced by resistor 541 in response to the pulsed-reference-current signal P_REF_I, the voltage level of reference signal VIREF produced by reference-generator filter 541 may be proportional to, and thus representative of, the average output current of flyback converter 120.

Figure 5B:
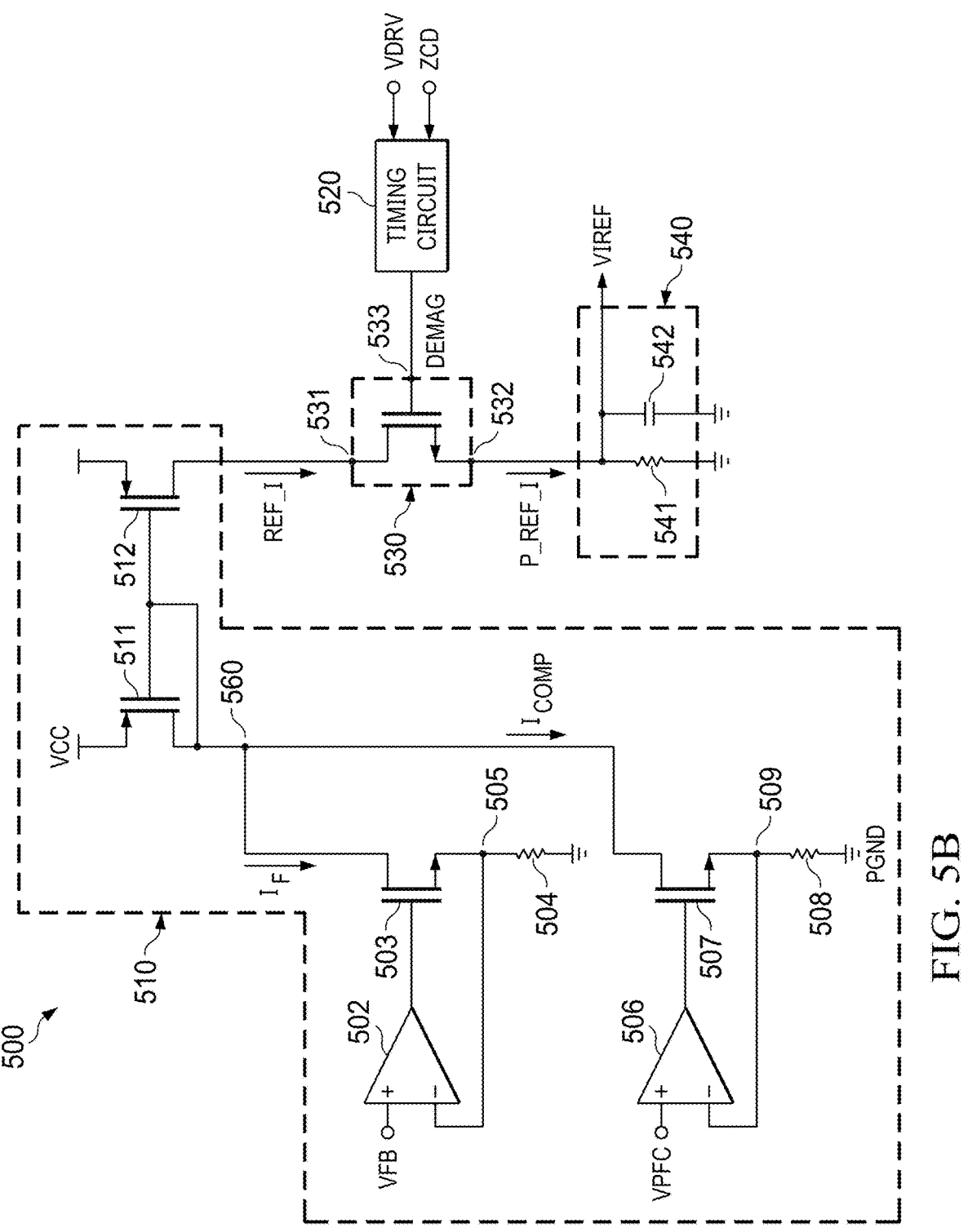
FIG. 5B illustrates a schematic diagram of a reference generator in accordance with embodiments of the present disclosure.

FIG. 5B illustrates a schematic diagram of reference generator 500 in accordance with embodiments of the present disclosure. Reference generator 500 may serve as an alternate embodiment of reference generator 331 shown in FIG. 4. Reference generator 500 may be implemented in any suitable fashion according to the operation described in the present disclosure. In some embodiments, reference generator 500 may include reference-current generator 510, timing circuit 520, reference-generator transistor 530, and reference-generator filter 540.

As described below, reference generator 500 shown in FIG. 5B may operate in a similar manner as reference generator 331 shown in FIG. 5A. And unless otherwise noted, elements of reference generator 500 may operate in a similar manner as those elements sharing the same reference numeral in reference generator 331.

As described above with reference to FIG. 3, the feedback voltage VFB may be used to represent the peak primary winding current $I_{PRI\_PEAK}$ because comparator 324 may instruct PWM circuit 326 to drive VDRV low to stop the on-time of switch 125 when the voltage level of the current-sense signal CS reaches the voltage level of the feedback voltage VFB. In some embodiments, comparator 324 and PWM circuit 326 may have a propagation delay between the time that comparator 324 trips and the time that PWM circuit 326 drives VDRV low to turn off switch 125. During this propagation delay, the primary winding current $I_{PRI}$ may continue to rise at a rate proportional to the voltage at flyback input 121. In other words, the peak primary winding $I_{PRI\_PEAK}$ may be proportional to the feedback voltage VFB plus an additional value corresponding to the propagation delay and proportional to the input voltage at flyback input 121. As described below, reference generator 500 shown in FIG. 5B may operate similarly to reference generator 331 described above with reference to FIG. 5A, but may include compensation to account for the additional value of the peak primary winding $I_{PRI\_PEAK}$ corresponding to the aforementioned propagation delay.

Reference-current generator 510 may be implemented in any suitable fashion according to the operation described in the present disclosure. Reference-current generator 510 may be configured to generate a reference current signal REF_I in response to the feedback voltage VFB based on the output voltage of the flyback converter and the compensation signal $I_{COMP}$ proportional to an input voltage at flyback input 121 of flyback converter 120. Reference-current generator 510 may include amplifier 502, transistor 503, and resistor 504. Amplifier 502, transistor 503, and resistor 504 may operate in a similar manner as described above with reference-current generator 501 in FIG. 5A to generate a current $I_F$ proportional to the feedback voltage VFB. In addition, reference-current generator 510 may include amplifier 506, transistor 507, and resistor 508. Amplifier 506 may have a positive input terminal coupled to receive VPFC. As described above with reference to FIG. 1, VPFC may be proportional to the output voltage of PFC circuit 110. Because the flyback input 121 is coupled to PFC output 116 of PFC circuit 110, VPFC may also represent a voltage proportional to the input voltage of flyback converter 120. Amplifier 506 may also have a negative input terminal coupled to receive feedback from node 509. The output of amplifier 506 may be coupled to the gate of transistor 507, which may be coupled in a source-follower configuration with its source coupled to node 509. In some embodiments, transistor 507 may be an NMOS transistor. Resistor 508 may be coupled between node 509 and primary-side ground PGND. Amplifier 506 may drive transistor 507 to cause the voltage at node 509 to be equal to VPFC. Accordingly, the current through transistor 507 may be equal to VPFC divided by the resistance of resistor 508. The compensation signal $I_{COMP}$ may thus be proportional to the input voltage at flyback input 121 of flyback converter 120. Although the example embodiment illustrated in FIG. 5B utilizes VPFC as a signal proportional to the input voltage of flyback converter 120, other embodiments may use any other signal proportional to the input voltage of flyback converter 120 to generate $I_{COMP}$, including for example, the input voltage of flyback converter 120 as reflected by auxiliary winding 122c during the on-time of switch 125.

As shown in FIG. 5B, $I_F$ and $I_{COMP}$ may be summed together at node 560 and mirrored by transistors 511 and 512 to generate the reference current signal REF_I. Accordingly, reference-current generator 510 may generate the reference current signal REF_I in response to the feedback voltage VFB based on the output voltage VOUT of flyback converter 120 and the compensation signal $I_{COMP}$ proportional to the input voltage at flyback input 121 of flyback converter 120.

Timing circuit 520, reference-generator transistor 530, and reference-generator filter 540 of reference generator 500 may each operate in a similar manner as described above for reference generator 331 shown in FIG. 5A. Accordingly, reference-generator transistor 530 may gate the reference current signal REF_I based on the demagnetization signal DEMAG, and output the pulsed-reference-current signal P_REF_I based on the reference current signal REF_I and the demagnetization signal DEMAG in a similar manner as described above for FIG. 5A. Reference-generator filter 540 may likewise receive the pulsed-reference-current signal P_REF_I and produce the reference signal VIREF in the form of a voltage representative of an average output current of flyback converter 120 in a similar manner as described above with reference to FIG. 5A.

Figure 6:
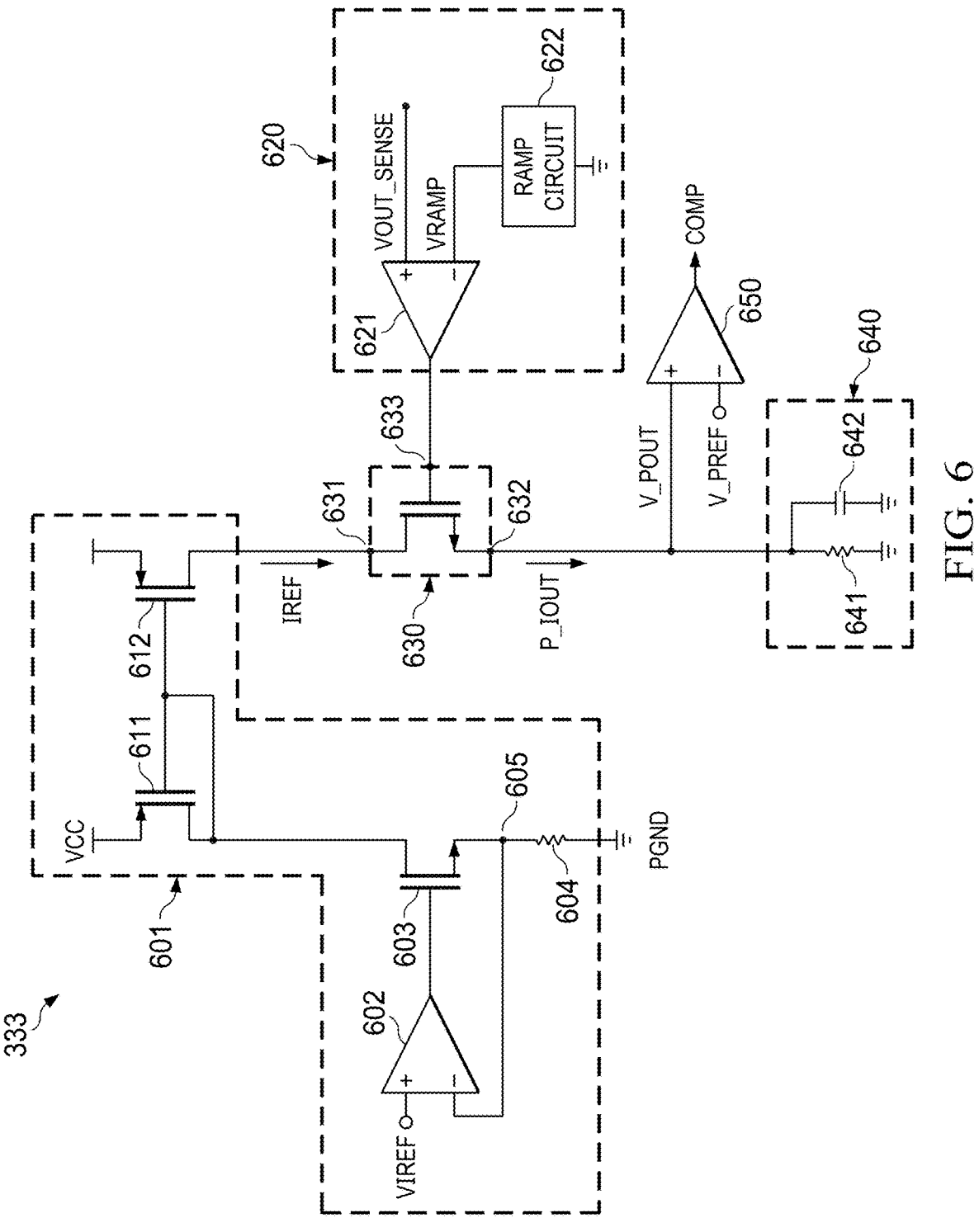
FIG. 6 illustrates a schematic diagram of a power calculation circuit in accordance with embodiments of the present disclosure.

FIG. 6 illustrates a schematic diagram of power calculation circuit 333 in accordance with embodiments of the present disclosure. Power calculation circuit 333 may be implemented in any suitable fashion according to the operation described in the present disclosure. In some embodiments, power calculation circuit 333 may include voltageto-current converter 601, duty cycle circuit 620, filter 640, and power-threshold comparator 650.

Voltage-to-current converter 601 may be implemented in any suitable fashion according to the operation described in the present disclosure. Voltage-to-current converter 601 may be configured to receive reference signal VIREF representative of the average output current of flyback converter 120, and to generate a current signal IREF representative of the average output current of flyback converter 120. In some embodiments, voltage-to-current converter 601 may include amplifier 602, transistor 603, resistor 604, and a current mirror formed by transistors 611 and 612. Amplifier 602 may have a positive input terminal coupled to receive reference signal VIREF and a negative input terminal coupled to receive feedback from node 605. The output of amplifier 602 may be coupled to the gate of transistor 603, which may be coupled in a source-follower configuration with its source coupled to node 605. In some embodiments, transistor 603 may be an NMOS transistor. Resistor 604 may be coupled between node 605 and primary-side ground PGND. Amplifier 602 may drive transistor 603 to cause the voltage at node 605 to be equal to the voltage of the reference signal VIREF. Accordingly, the current through transistor 603 may be equal to the voltage of the reference signal VIREF divided by the resistance of resistor 604.

The drain of transistor 603 may be coupled to the current mirror formed by transistors 611 and 612. In some embodiments, each of transistors 611 and 612 may be a PMOS transistor. Transistor 611 may have a drain coupled to the drain of transistor 603, and may thus receive the current equal to the voltage of the reference signal VIREF divided by the resistance of resistor 604. Transistor 611 may have a gate coupled to its drain and a source coupled to VCC. Transistor 612 may have a gate coupled to the gate of transistor 611 and a source coupled to VCC. Transistor 612 may thus mirror the current from transistor 603. As shown in FIG. 6, voltage-to-current converter 601 may thus generate a current signal IREF based on the voltage of the reference signal VIREF and the resistance value of resistor 604.

As shown in FIG. 6, duty cycle circuit 620 may include comparator 621 and ramp circuit 622. Duty cycle circuit 620 may be implemented in any suitable fashion according to the operation described in the present disclosure. In some embodiments, comparator 621 may have a positive input terminal coupled to receive the sense signal VOUT_SENSE. As described above with reference to FIG. 4, the sense signal VOUT_SENSE may be representative of the output voltage of flyback converter 120. In some embodiments, comparator 621 may also have a negative terminal coupled to receive a cyclical ramp signal VRAMP from ramp circuit 622. The cyclical ramp signal VRAMP generated by ramp circuit 622 may have a voltage range normalized to a range of output voltage settings potentially selected by feedback controller 131. For example, in embodiments where feedback controller 131 may select any one of a plurality of output voltage settings up to 20 V, the cyclical ramp signal VRAMP may be normalized to the voltage level of VOUT_SENSE when VOUT is at 20V. Comparator 621 may compare the sense signal VOUT_SENSE against the cyclical ramp signal VRAMP, and may thus output a repeating pulse signal having a duty cycle corresponding to the voltage level of the sense signal VOUT_SENSE. For example, the duty cycle of the repeating pulse signal may increase as VOUT_SENSE increases within the normalized range of the cyclical ramp signal VRAMP.

As shown in FIG. 6, transistor 630 in power calculation circuit 333 may have a first conduction terminal 631 coupled to receive the current signal IREF representative of the average output current of flyback converter 120, a gate 633 coupled to comparator 621 to receive the repeating pulse signal from the output of comparator 621, and a second conduction terminal 632 configured to output a output-power signal P_IOUT based on the current signal IREF and the repeating pulse signal. For example, when the repeating pulse signal output by comparator 621 is high, transistor 630 may be driven in an on-state and may thus pass the current signal IREF from its first conduction terminal 631 to its second conduction terminal 632. Conversely, when the repeating pulse signal output by comparator 621 is low, transistor 630 may be driven in an off-state and may thus block the current signal IREF. The second conduction terminal 632 may thus be configured to provide the output-power signal P_IOUT based on the current signal IREF and the repeating pulse signal output by comparator 621. Because the current signal IREF is representative of the average output current of flyback converter 120, and because the repeating pulse signal driving gate 633 of transistor 630 has a duty cycle corresponding to the output voltage VOUT of flyback converter 120, the time-averaged current of the output-power signal P_IOUT may be proportional to the output power of flyback converter 120.

As shown in FIG. 6, filter 640 in power calculation circuit 333 may be coupled to receive the output-power signal P_IOUT. Filter 640 may be implemented in any suitable fashion according to the operation described in the present disclosure. In some embodiments, filter 640 may be an RC filter. For example, filter 640 may include resistor 641 and capacitor 642 coupled in parallel to each other and between the second conduction terminal 632 of transistor 630 and primary-side ground PGND. As the output-power signal P_IOUT passes through resistor 641, resistor 641 may develop a voltage that is filtered by capacitor 642. Filter 640 may thus be coupled to receive the output-power signal P_IOUT and to generate a voltage signal V_POUT proportional to and representative of the output power of flyback converter 120. Although filter 640 is shown in the example embodiment of FIG. 6 as a first-order RC filter, filter 640 may be implemented in any suitable fashion, including for example as a second-order RC filter.

As shown in FIG. 6, power-threshold comparator 650 may be coupled to filter 640 and may be configured to compare the voltage signal V_POUT proportional to the output power of flyback converter 120 against a power threshold V_PREF. For example, power-threshold comparator 650 may include a positive terminal coupled to receive the voltage signal V_POUT and a negative terminal coupled to receive the power threshold V_PREF. Power-threshold comparator 650 may thus be configured to generate the comparison signal COMP at its output based on the comparison of the voltage signal V_POUT proportional to the output power of flyback converter 120 against a power threshold V_PREF.

As described above with reference to FIG. 3, flyback control circuit 320 may be configured to receive the comparison signal COMP from power calculation circuit 333 of power detector 330 and to set an operating characteristic of flyback converter 120 based on the comparison signal COMP. For example, in the quasi-resonant control scheme of flyback control circuit 320, flyback control circuit 320 may, based on the comparison signal COMP, adjust the operating valley at which flyback control circuit 320 turns on switch 125 of flyback converter 120 to begin a next switching cycle. For example, in response to normal or heavy load conditions where the comparison signal COMP is driven high to indicate the output power is above the power threshold, flyback control circuit 320 may set the operating valley at the first valley after the demagnetization time has concluded. And in response to light load conditions where the comparison signal COMP may be driven low to indicate the output power is below the power threshold, flyback control circuit 320 may set the operating valley at the second or a subsequent valley after the demagnetization time as concluded. Flyback control circuit 320 may thus, in response to the comparison signal COMP, reduce the switching frequency and the associated switching loss during the light load conditions.

As also described above with reference to FIG. 3, PFC control circuit 310 may be configured to receive the comparison signal COMP from power calculation circuit 333 of power detector 330 and to disable PFC circuit 110 based on the comparison signal COMP. In some embodiments, PFC control circuit 310 may be configured to enable or disable PFC circuit 110 based on the comparison signal COMP. For example, in response to normal or heavy load conditions where the comparison signal COMP is driven high to indicate the output power is above the power threshold, PFC control circuit 310 may enable PFC circuit 110 by allowing the PDRV signal to drive switch 112 of PFC circuit 110 on and off according to the designed PFC control scheme. PFC circuit 110 may thus provide power-factor correction to switching power converter 100 during normal and heavy load conditions. During light load conditions, when the power delivered at the output of switching power converter 100 is low, the power factor correction provided by PFC circuit 110 may be of limited benefit. Thus, in response to light load conditions where the comparison signal COMP may be driven low to indicate the output power is below the power threshold, PFC control circuit 310 may disable PFC circuit 110. Specifically, PFC control circuit 310 may disable PFC circuit 110 by holding the PDRV signal continuously low to hold switch 112 in an off-state. When switch 112 is held in an off-state, power may still flow through inductor 111 and diode 113 of PFC circuit 110 to the flyback input 121 of flyback converter 120. Flyback converter 120 may thus continue to regulate the output voltage VOUT when PFC circuit 110 is disabled. The efficiency of switching power converter 100 may be improved during such low-power conditions by saving the switching loss associated with repeatedly turning switch 112 on and off.

In some embodiments, one or both of resistor 641 and capacitor 642 may be included on the same integrated circuit as components of power detector 330 and power converter controller 150. In other embodiments, one or both of resistor 641 and capacitor 642 may be discrete components implemented separately from an integrated circuit on which components of power detector 330 and power converter controller 150 may be included. When implemented as separate discrete components, a user may be able to effectively scale the output power at which power-threshold comparator 650 may trip the comparison signal COMP. For example, the power threshold V_PREF may be set to a constant voltage by on-chip circuitry. By selecting the resistance value for resistor 641, a user may determine the output power required to trip power-threshold comparator 650. For example, by increasing the resistance value of resistor 641, a user may lower the time-averaged value of P_IREF that would be required for the voltage signal V_POUT to reach the power threshold V_PREF. Thus, by increasing the resistance value of resistor 641, a user may lower the value of the output power of flyback converter 120 that may trip power-threshold comparator 650. Conversely, by reducing the resistance value of resistor 641, a user may increase the value of the output power of flyback converter 120 that may trip power-threshold comparator 650.

FIG. 7 illustrates a method for operating switching power converter 100 in accordance with embodiments of the present disclosure. Method 700 may be performed by any suitable mechanism, such as power detector 330, PFC control circuit 310, flyback control circuit 320, or any suitable combination thereof. Method 700 may be performed with fewer or more steps than shown in FIG. 7. Moreover, steps of method 700 may be omitted, repeated, performed in parallel, performed in a different order than shown in FIG. 7, or performed recursively. One or more steps of method 700, although shown in an order, may be performed at the same time or in a re-ordered manner.

Step 702 may include generating a sense signal representative of an output voltage of the flyback converter. For example, as described above with reference to FIG. 4, sense circuit 332 may include sample-and-hold circuitry that may sample VAUX during a time within the demagnetization period when the secondary-winding current $I_{SEC}$ is flowing in the secondary side of flyback converter 120. The sample-and-hold circuitry may then hold that sampled voltage during the remainder of the switching cycle and may output the sense signal VOUT_SENSE representative of the output voltage VOUT of flyback converter 120.

Step 704 may include generating a reference signal representative of an average output current of the flyback converter. For example, as described above with reference to FIGS. 4, 5A and 5B, reference generator 331 may generate a reference signal VIREF representative of an average output current of flyback converter 120.

Step 706 may include generating an output-power signal in response to the sense signal and the reference signal. For example, as described above with reference to FIG. 4 and FIG. 6, power calculation circuit 333 may generate an output-power signal P_IOUT in response to the sense signal VOUT_SENSE and the reference signal VIREF.

Step 708 may include controlling an operating characteristic of the flyback converter based at least in part on the output-power signal. For example, as described above with reference to FIG. 6, filter 640 may filter the output-power signal P_IOUT to generate a voltage signal V_POUT corresponding to the output power of flyback converter 120. In turn, power-threshold comparator 650 may output a comparison signal COMP based on a comparison of the voltage signal V_POUT proportional to the output power of flyback converter 120 against a power threshold V_PREF. In response to the comparison signal COMP, and as described above with reference to FIG. 3, flyback control circuit 320 may control an operating characteristic of flyback converter 120. For example, in the quasi-resonant control scheme of flyback control circuit 320, flyback control circuit 320 may, based on the comparison signal COMP, adjust the operating valley at which flyback control circuit 320 turns on switch 125 of flyback converter 120 to begin a next switching cycle.

Step 710 may include disabling a power-factor correction (PFC) circuit coupled to the flyback converter based at least in part on the output-power signal. For example, as described above with reference to FIG. 6, filter 640 may filter the output-power signal P_IOUT to generate a voltage signal V_POUT corresponding to the output power of flyback converter 120. In turn, power-threshold comparator 650 may output a comparison signal COMP based on a comparison of the voltage signal V_POUT proportional to the output power of flyback converter 120 against a power threshold V_PREF. As described above with reference to FIG. 3, during light load conditions, when the power delivered at the output of switching power converter 100 is low, the power factor correction provided by PFC circuit 110 may be of limited benefit. Thus, in response to light load conditions where the comparison signal COMP may be driven low to indicate the output power is below the power threshold, PFC control circuit 310 may disable PFC circuit 110.

FIG. 8 illustrates a method for operating switching power converter 100 in accordance with embodiments of the present disclosure. Method 800 may be performed by any suitable mechanism, such as power detector 330, PFC control circuit 310, flyback control circuit 320, or any suitable combination thereof. Method 800 may be performed with fewer or more steps than shown in FIG. 8. Moreover, steps of method 800 may be omitted, repeated, performed in parallel, performed in a different order than shown in FIG. 8, or performed recursively. One or more steps of method 800, although shown in an order, may be performed at the same time or in a re-ordered manner.

Step 802 may include generating a reference current signal based on a feedback voltage representative of the output voltage of the flyback converter. For example, as described above with reference to FIG. 5A, reference-current generator 501 may generate a reference current signal REF_I in response to the feedback voltage VFB that may be based on the output voltage of flyback converter 120.

Step 804 may include generating a demagnetization signal based on a demagnetization time of a secondary winding of the flyback converter. For example, timing circuit 520 may generate the demagnetization signal DEMAG based on a demagnetization time of secondary winding 122b of flyback converter 120. In some embodiments, timing circuit 520 may receive the drive signal VDRV and the zero-cross signal ZCD. The end of the drive signal VDRV for switch 125 on the primary side of flyback converter 120 may align with the beginning of the demagnetization time. And the zero-cross signal ZCD may indicate that the secondary-winding current $I_{SEC}$ has reached zero at the end of the demagnetization time. Accordingly, timing circuit 520 may generate the demagnetization signal DEMAG based on the demagnetization time of secondary winding 122b, as indicated by the drive signal VDRV and the zero-cross signal ZCD.

Step 806 may include gating the reference current signal based on the demagnetization signal to generate a pulsed-reference-current signal. For example, reference-generator transistor 530 shown in FIG. 5A may gate the reference current signal REF_I based on the demagnetization signal DEMAG to generate the pulsed-reference-current signal P_REF_I. Specifically, when the demagnetization signal DEMAG driving gate 533 of reference-generator transistor 530 is high, reference-generator transistor 530 may pass the reference current signal REF_I received at its first conduction terminal 531 to its second conduction terminal 532. And when the demagnetization signal DEMAG driving gate 533 of reference-generator transistor 530 is low, reference-generator transistor 530 may block the reference current signal REF_I.

Step 808 may include filtering the pulsed-reference-current signal to generate a reference signal representative of the average output current of the flyback converter. For example, as shown in FIG. 5A, reference-generator filter 540 may receive the pulsed-reference-current signal P_REF_I from the second conduction terminal 532 of reference-generator transistor 530. Reference-generator filter 540 may filter the pulsed-reference-current signal P_REF_I to generate a reference signal VIREF representative of the average output current of flyback converter 120.

Step 810 may include generating a current signal representative of an average output current of a flyback converter. For example, as described above with reference to FIG. 6, voltage-to-current converter 601 may be configured to receive reference signal VIREF representative of the average output current of flyback converter 120, and to generate a current signal IREF representative of the average output current of flyback converter 120. In particular, voltage-to-current converter 601 may generate the current signal IREF by converting a voltage of the reference signal VIREF into a current.

Step 812 may include generating a repeating pulse signal having a duty cycle corresponding to an output voltage of the flyback converter. For example, as describe above with reference to FIG. 6, comparator 621 may compare the sense signal VOUT_SENSE against the cyclical ramp signal VRAMP, and may thus generate a repeating pulse signal having a duty cycle corresponding to the voltage level of the sense signal VOUT_SENSE, which in turn corresponds to the output voltage VOUT of flyback converter 120.

Step 814 may include gating the current signal based on the repeating pulse signal to generate a pulsed-current signal. For example, transistor 630 shown in FIG. 6 may gate the current signal IREF based on repeating pulse signal from comparator 621 to generate an output-power signal P_IOUT. Specifically, when the repeating pulse signal driving gate 633 of transistor 630 is high, transistor 630 may pass the current signal IREF received at its first conduction terminal 631 to its second conduction terminal 632. And when the repeating pulse signal driving gate 633 of transistor 630 is low, transistor 630 may block the current signal IREF.

Step 816 may include filtering the output-power signal to generate a voltage signal corresponding to an output power of the flyback converter. For example, filter 640 shown in FIG. 6 may be coupled to receive the output-power signal P_IOUT from the second conduction terminal 632 of transistor 630. Filter 640 may filter the output-power signal P_IOUT to generate a voltage signal V_POUT corresponding to the output power of flyback converter 120. Specifically, as the output-power signal P_IOUT passes through resistor 641 of filter 640, resistor 641 may develop a voltage filtered by capacitor 642. Filter 640 may thus receive the output-power signal P_IOUT and filter the output-power signal P_IOUT to generate the voltage signal V_POUT proportional to the output power of flyback converter 120.

Step 818 may include controlling an operating characteristic of the flyback converter based on a comparison of the voltage signal against a power threshold. For example, power-threshold comparator 650 shown in FIG. 6 may output a comparison signal COMP based on a comparison of the voltage signal V_POUT proportional to the output power of flyback converter 120 against a power threshold V_PREF. In response to the comparison signal COMP, and as described above with reference to FIG. 3, flyback control circuit 320 may control an operating characteristic of flyback converter 120 based on the comparison signal COMP. For example, in the quasi-resonant control scheme of flyback control circuit 320, flyback control circuit 320 may, based on the comparison signal COMP, adjust the operating valley at which flyback control circuit 320 turns on switch 125 of flyback converter 120 to begin a next switching cycle.

Step 820 may include disabling a power-factor correction (PFC) circuit coupled to the flyback converter based on a comparison of the output power signal against a power threshold. For example, power-threshold comparator 650 shown in FIG. 6 may output a comparison signal COMP based on a comparison of the voltage signal V_POUT proportional to the output power of flyback converter 120 against a power threshold V_PREF. As described above with reference to FIG. 3, during light load conditions, when the power delivered at the output of switching power converter 100 is low, the power factor correction provided by PFC circuit 110 may be of limited benefit. Thus, in response to light load conditions where the comparison signal COMP may be driven low to indicate the output power is below the power threshold, PFC control circuit 310 may disable PFC circuit 110.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

The invention claimed is:

1. A power detector, comprising:
a primary-side sense circuit configured to generate a current representative of an output voltage of a flyback converter;
a primary-side reference generator configured to produce a reference signal representative of an average output current of the flyback converter, wherein the reference signal is produced by the primary-side reference generator based on a demagnetization signal that corresponds to a demagnetization time of a secondary winding of a transformer of the flyback converter; and
a primary-side power calculation circuit configured to generate an output-power signal in response to the sense signal and the reference signal.

2. The power detector of claim 1, wherein the primary-side power calculation circuit comprises:
a voltage-to-current converter configured to receive the reference signal representative of the average output current of the flyback converter and to generate a current signal representative of the average output current of the flyback converter;
a comparator configured to compare the sense signal representative of the output voltage of the flyback converter against a cyclical ramp signal and to output a repeating pulse signal having a duty cycle corresponding to a voltage level of the sense signal; and
a transistor having:
a first conduction terminal coupled to receive the current signal representative of the average output current of the flyback converter;
a gate coupled to the comparator to receive the repeating pulse signal; and
a second conduction terminal configured to provide the output-power signal based on the current signal and the repeating pulse signal, wherein a time-averaged current of the output-power signal is proportional to an output power of the flyback converter.

3. The power detector of claim 1, further comprising a filter coupled to receive the output-power signal and to generate a voltage signal proportional to an output power of the flyback converter.

4. The power detector of claim 3, further comprising a power-threshold comparator coupled to the filter and configured to compare the voltage signal proportional to the output power of the flyback converter against a power threshold.

5. The power detector of claim 1, wherein the primary-side reference generator comprises:
a reference-generator transistor having:
a first conduction terminal coupled to receive a reference current signal;
a gate coupled to receive the demagnetization signal to drive the reference-generator transistor in an on-state for a period corresponding to the demagnetization time of the secondary winding of the transformer of the flyback converter; and
a second conduction terminal configured to output a pulsed-reference-current signal based on the reference current signal and the demagnetization signal; and
a reference-generator filter comprising a resistor and a capacitor and configured to receive the pulsed-reference-current signal and to produce the reference signal representative of the average output current of the flyback converter.

6. The power detector of claim 5, wherein the primary-side reference generator further comprises a reference-current generator configured to generate the reference current signal in response to a feedback voltage that is based on the output voltage of the flyback converter.

7. The power detector of claim 5, wherein the primary-side reference generator further comprises a reference-current generator configured to generate the reference current signal in response to a feedback voltage that is based on the output voltage of the flyback converter and a compensation signal proportional to an input voltage at in input of the flyback converter.

8. The power detector of claim 5, wherein the primary-side reference generator further comprises a timing circuit, the timing circuit configured to generate the demagnetization signal based on an end time of a drive signal for a switch of the flyback converter and a zero-cross signal indicating a secondary-winding current of the transformer of the flyback converter has reached zero.

9. A power converter controller, comprising:
a flyback control circuit configured to control a switch of a flyback converter; and
a power detector comprising:
a primary-side sense circuit configured to generate a sense signal representative of an output voltage of the flyback converter;
a primary-side reference generator configured to generate a reference signal representative of an average output current of the flyback converter, wherein the reference signal is produced by the primary-side reference generator based on a demagnetization signal that corresponds to a demagnetization time of a secondary winding of a transformer of the flyback converter; and
a primary-side power calculation circuit configured to generate an output-power signal in response to the sense signal and the reference signal.

10. The power converter controller of claim 9, wherein the primary side power calculation circuit comprises:
a voltage-to-current converter configured to receive the reference signal representative of the average output current of the flyback converter and to generate a current signal representative of the average output current of the flyback converter;

a comparator configured to compare the sense signal representative of the output voltage of the flyback converter against a cyclical ramp signal and to output a repeating pulse signal having a duty cycle corresponding to a voltage level of the sense signal; and a transistor having:

a first conduction terminal coupled to receive the current signal representative of the average output current of the flyback converter;

a gate coupled to the comparator to receive the repeating pulse signal; and a second conduction terminal configured to provide the output-power signal based on the current signal and the repeating pulse signal, wherein a time-averaged current of the output-power signal is proportional to an output power of the flyback converter.

11. The power converter controller of claim 9, wherein the power detector further comprises a filter coupled to receive the output-power signal and to generate a voltage signal proportional to an output power of the flyback converter.

12. The power converter controller of claim 11, wherein the power detector further comprises a power-threshold comparator coupled to the filter and configured to generate a comparison signal based on a comparison of the voltage signal proportional to the output power of the flyback converter against a power threshold.

13. The power converter controller of claim 12, wherein the flyback control circuit is configured to receive the comparison signal from the power detector and to set an operating characteristic of the flyback converter based on the comparison signal.

14. The power converter controller of claim 12, wherein:

the power converter controller further comprises a power-factor correction (PFC) control circuit configured to control a PFC switch of a PFC circuit; and the PFC control circuit is configured to receive the comparison signal from the power detector and to disable the PFC circuit based on the comparison signal.

15. The power converter controller of claim 9, wherein the primary-side reference generator further comprises:

a reference-generator transistor having:

a first conduction terminal coupled to receive a reference current signal;

a gate coupled to receive the demagnetization signal to drive the reference-generator transistor in an on-state for a period corresponding to the demagnetization time of the secondary winding of the transformer of the flyback converter; and a second conduction terminal configured to output a pulsed-reference-current signal based on the reference current signal and the demagnetization signal; and a reference-generator filter comprising a resistor and a capacitor and configured to receive the pulsed-reference-current signal and to produce the reference signal representative of the average output current of the flyback converter.

16. A method, comprising:

generating a sense signal representative of an output voltage of a flyback converter;

generating a reference signal representative of an average output current of the flyback converter based on a demagnetization signal that corresponds to a demagnetization time of a secondary winding of a transformer of the flyback converter; and generating an output-power signal in response to the sense signal and the reference signal; and wherein each of the sense signal, the reference signal, and the output-power signal is generated on a primary side of the flyback converter.

17. The method of claim 16, further comprising:

generating a current signal representative of the average output current of the flyback converter;

generating a repeating pulse signal having a duty cycle corresponding to the output voltage of the flyback converter;

gating the current signal based on the repeating pulse signal to generate the output-power signal, wherein a time-averaged current of the output-power signal is proportional to an output power of the flyback converter; and filtering the output-power signal to generate a voltage signal corresponding to the output power of the flyback converter.

18. The method of claim 17, further comprising:

generating a reference current signal in response to a feedback voltage that is based on the output voltage of the flyback converter;

generating the demagnetization signal based on the demagnetization time of the secondary winding of the flyback converter; and gating the reference current signal based on the demagnetization signal to generate a pulsed-reference-current signal; and filtering the pulsed-reference-current signal to generate the reference signal representative of the average output current of the flyback converter.

19. The method of claim 16, further comprising controlling an operating characteristic of the flyback converter based at least in part on the output-power signal.

20. The method of claim 16, further comprising disabling a power-factor correction (PFC) circuit coupled to the flyback converter based at least in part on the output-power signal.

* * * * *